(12) United States Patent
Shirouzu

(10) Patent No.: US 8,860,705 B2
(45) Date of Patent: Oct. 14, 2014

(54) IMAGE DISPLAY DEVICE AND MODIFICATION METHOD PERFORMED BY THE SAME

(75) Inventor: Hiroshi Shirouzu, Shiga (JP)

(73) Assignee: Panasonic Corporation, Osaka (JP)

( * ) Notice: Subject to any disclaimer, the term of this patent is extended or adjusted under 35 U.S.C. 154(b) by 425 days.

(21) Appl. No.: 13/074,603

(22) Filed: Mar. 29, 2011

(65) Prior Publication Data
US 2011/0175885 A1 Jul. 21, 2011

Related U.S. Application Data

(63) Continuation of application No. PCT/JP2010/001947, filed on Mar. 18, 2010.

(30) Foreign Application Priority Data

Apr. 7, 2009 (JP) ................. 2009-093440

(51) Int. Cl.
*G09G 3/00* (2006.01)
*H01L 27/32* (2006.01)
*G09G 3/32* (2006.01)

(52) U.S. Cl.
CPC ....... *H01L 27/3265* (2013.01); *H01L 2251/568* (2013.01); *G09G 3/006* (2013.01); *G09G 2360/16* (2013.01); *G09G 2320/0285* (2013.01); *G09G 2330/10* (2013.01); *G09G 2300/0842* (2013.01); *G09G 2330/08* (2013.01); *G09G 3/3233* (2013.01)
USPC ........................................................ 345/211

(58) Field of Classification Search
USPC ................................................ 345/211, 174
See application file for complete search history.

(56) References Cited

U.S. PATENT DOCUMENTS

| 5,132,819 A | 7/1992 | Noriyama et al. |
| 6,839,099 B2 | 1/2005 | Fukunishi |

(Continued)

FOREIGN PATENT DOCUMENTS

| CN | 1327167 | 12/2001 |
| CN | 1581279 | 2/2005 |

(Continued)

OTHER PUBLICATIONS

International Search Report in PCT/JP2010/001947 dated Apr. 13, 2010.

(Continued)

*Primary Examiner* — Jason Olson
*Assistant Examiner* — Damon Treitler
(74) *Attorney, Agent, or Firm* — Greenblum & Bernstein P.L.C.

(57) ABSTRACT

An image display device includes a luminescent panel in which luminescent pixels are two-dimensionally arranged. Each luminescent pixel has a stacked luminescent layer and driving layer. The driving layer includes a capacitive element that includes two electrode layers stacked in parallel. A memory stores coordinate information of a repaired luminescent pixel in which the capacitive element is repaired through disconnection of a part of one of the two electrode layers. A controller converts video signals received by the image display device into luminescent pixel signals that determine luminescence of the luminescent pixels. The controller outputs the luminescent pixel signals to a driver in a scanning order. The controller includes an incremental operator that increases one of the luminescent pixel signals that corresponds to the repaired luminescent pixel after reading only the coordinate information from the memory and comparing information of the video signals with the coordinate information in the scanning order.

12 Claims, 12 Drawing Sheets

(56) References Cited

U.S. PATENT DOCUMENTS

| | | | |
|---|---|---|---|
| 7,330,222 B2 | 2/2008 | Shiraki et al. | |
| 2001/0052889 A1 | 12/2001 | Fukunishi | |
| 2005/0162893 A1* | 7/2005 | Yagi et al. | 365/149 |
| 2005/0174500 A1 | 8/2005 | Shiraki et al. | |
| 2007/0046186 A1 | 3/2007 | Kim | |
| 2007/0182441 A1* | 8/2007 | Hwang | 324/770 |
| 2008/0315890 A1* | 12/2008 | Kasai et al. | 324/523 |

FOREIGN PATENT DOCUMENTS

| | | |
|---|---|---|
| CN | 1652005 | 8/2005 |
| EP | 0438138 | 7/1991 |
| JP | 03-242625 | 10/1991 |
| JP | 2001-330850 | 11/2001 |
| JP | 2003-316330 | 11/2003 |
| JP | 2007-066904 | 3/2007 |
| JP | 2007-212996 | 8/2007 |
| JP | 2008-203636 | 9/2008 |
| JP | 2009-003092 | 1/2009 |
| WO | 2008/047495 | 4/2008 |

OTHER PUBLICATIONS

China Office action, mail date is May 20, 2013.
An English language translation of JP 2001-330850.

* cited by examiner

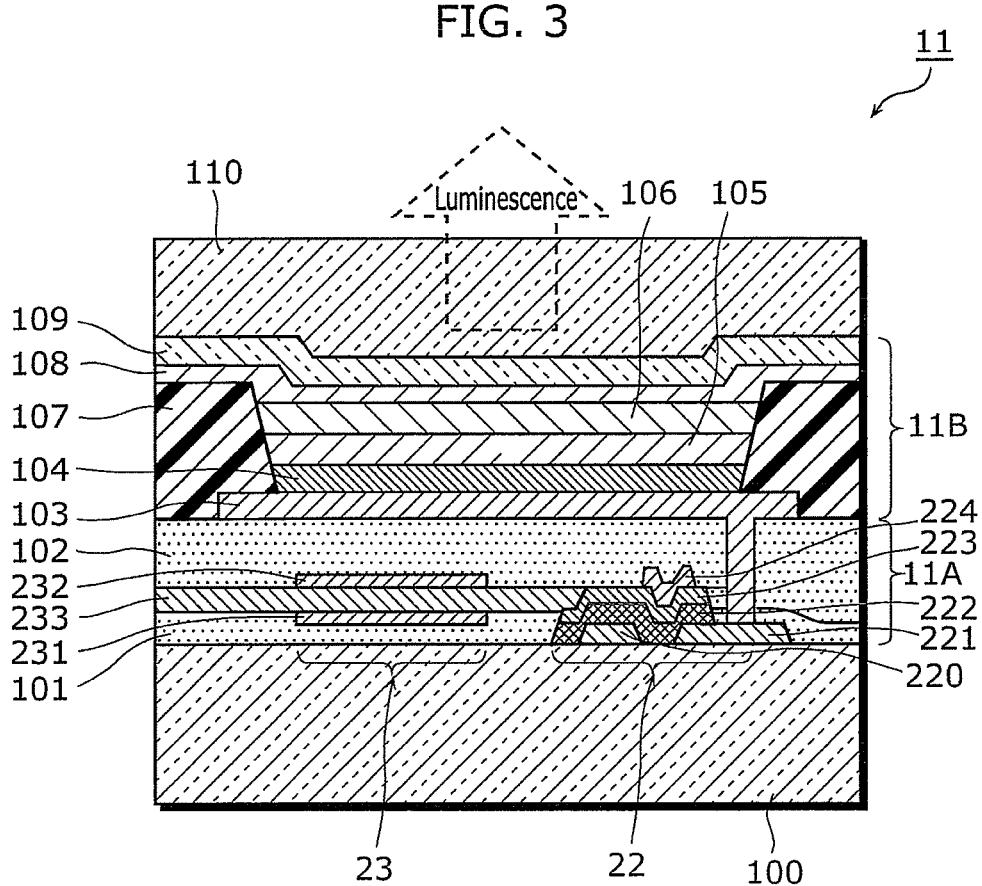

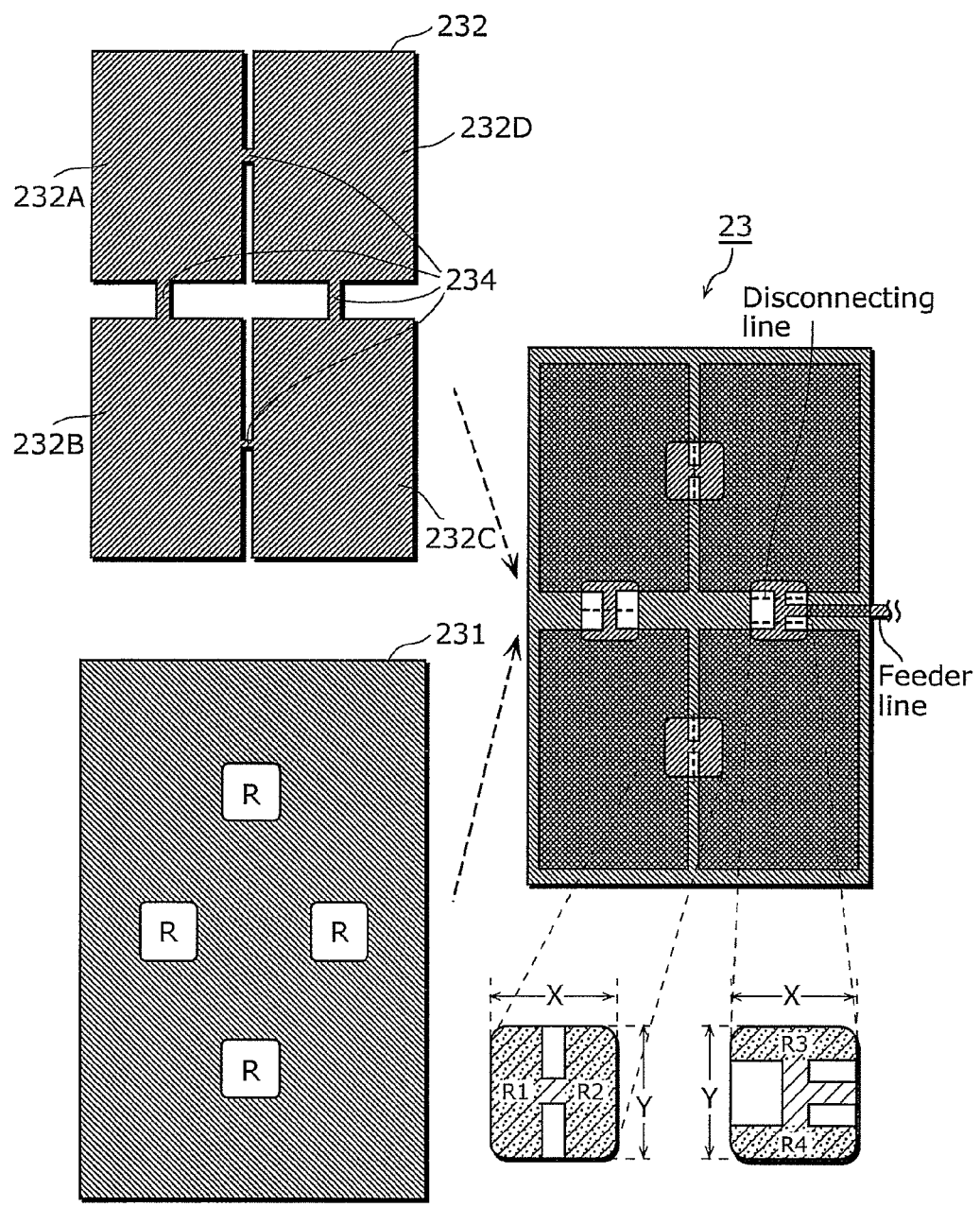

IMAGE DISPLAY DEVICE AND MODIFICATION METHOD PERFORMED BY THE SAME

CROSS REFERENCE TO RELATED APPLICATION

This is a continuation application of PCT application No. PCT/JP2010/001947, filed on Mar. 18, 2010, designating the United States of America, the disclosure of which, including the specification, drawings and claims, is incorporated herein by reference in its entirety.

The disclosure of Japanese Patent Application No. 2009-093440, filed on Apr. 7, 2009, including the specification, drawings, and claims is incorporated herein by reference in its entirety.

BACKGROUND OF THE INVENTION

1. Field of the Invention

The present invention relates to image display devices and modification methods performed by the same, and in particular to an image display device having a repairable pixel structure and a modification method performed by the same.

2. Description of the Related Art

Organic electro-luminescent (EL) displays including organic electro-luminescent elements (hereinafter referred to as organic EL elements) are known as image display devices including current-driven luminescent elements. The organic EL displays are attracting attention as a candidate for next-generation flat panel displays (FPDs) because they are viewable at wide angles and consume a small amount of power.

Usually, organic EL elements included in pixels are arranged in a matrix pattern. For example, in active-matrix organic EL displays, thin-film transistors (TFTs) are provided at intersections of scanning lines and data lines, and each TFT is connected with a capacitive element (capacitor) and the gate of a driving transistor. The TFT is turned on through a selected scanning line to allow a data signal to be provided to the driving transistor and the capacitive element through a corresponding data line so that the driving transistor and the capacitive element control the timing when the organic EL element produces luminescence. With this configuration of the pixel driving circuit, the active-matrix organic EL displays can cause the organic EL elements to keep producing luminescence until next scanning (selection), and thus there is no reduction in the display luminance even when the duty ratio increases. However, as typified by the active-matrix organic EL displays, when the complexity of the driving circuit configuration of the luminescent pixels increases or when the number of luminescent pixels increases, electrical troubles, such as a short circuit and/or an open circuit of circuit elements and wires, are more likely to occur during a manufacturing process which requires fine processing.

With organic EL panels, in particular, the capacitive elements included in the pixel driving circuits have a relatively wide element area. Consequently, the capacitive elements are susceptible to a particle or the like present between electrodes, thereby causing a higher percent defective of pixels through a short circuit.

Meanwhile, there is a method proposed for repairing a defective luminescent pixel after forming pixel driving circuit elements and wires. In order to repair a defective luminescent pixel which has become a bright point in a constant luminescent status due to a short circuit of a circuit element or the like, Patent Reference 1 (Japanese Unexamined Patent Application Publication No. 2008-203636) provides, in all the luminescent pixel regions, a non-overlapping portion connected to other conductive portions and wires with some distance therefrom. To repair a defective luminescent pixel, the non-overlapping portion is disconnected by laser irradiation. With this, transmission of electric signals to the defective luminescent pixel is blocked. Moreover, the defective luminescent pixel becomes a dark point with no damage from the laser irradiation.

Furthermore, in Patent Reference 2 (Japanese Unexamined Patent Application Publication No. 2007-66904), a pixel electrode formed in a luminescent region of each luminescent pixel is provided by connecting cells, so that by disconnecting a cell connection with a laser, only the defective luminescent cell is electrically insulated and becomes a dark point.

SUMMARY OF THE INVENTION

However, when a current-leaking part is to be repaired with a laser or the like with the structure described in Patent Reference 2 in order to deal with a shorted circuit of the capacitive element, which is the main cause of defective of pixels, the laser processing alters the quality of the insulating layer and the shape of the parts near the processed part. It is thus difficult to normalize the capacitive element.

Furthermore, although the structure and method described in Patent Reference 1 can make the capacitive element electrically insulated from the other circuit elements so that the capacitive element does not function, the defective luminescent pixel either becomes a dark point or produces luminescence with luminescent timing different from that of the other normal luminescent pixels. Therefore, even if it is possible to repair the defective luminescent pixel which has become a bright point, it is not possible to improve the display quality of the luminescent panel by making the defective luminescent pixel produce luminescence with proper luminescent timing.

Moreover, in the case where the capacitive element can be repaired without the laser processing as described in Patent Reference 2, a change in the electrode layers and the insulating layer of the capacitive element leads to a change in the capacitance. In that case, the repaired capacitive element can hold, in a steady state, a voltage corresponding to a signal voltage provided through a signal line, so as to cause the luminescent element to produce luminescence with proper luminescent timing. However, a change in the capacitance results in a change in the charge and discharge characteristics of the capacitive element in a transient state. For example, an off-leak current or the like in a thin-film transistor dedicated for pixel selection increases the speed of attenuation of the voltage held by the capacitive element whose capacitance has been reduced through the repair. The change in the speed of attenuation of the held voltage results in a difference in signal voltage applied to the luminescent element between the luminescent pixel having the repaired capacitive element and normal luminescent pixels, thereby causing a problem that complete luminance uniformity cannot be achieved with the same signal voltage.

The present invention, conceived in view of the above problem, aims to provide an image display device and a modification method performed by the same that enable a luminescent pixel whose short-circuited capacitive element has been repaired, to produce luminescence with proper luminescent timing and normal luminance.

To solve the above problems, the image display device according to an implementation of the present invention is an image display device that includes a luminescent panel in which luminescent pixels are two-dimensionally arranged, each luminescent pixel having a stacked structure of a luminescent layer and a driving circuit layer which includes a capacitive element for driving the luminescent layer, the image display device including: a memory in which coordinate information of a repaired luminescent pixel in the luminescent panel is stored in advance, the repaired luminescent pixel including a capacitive element repaired through disconnection of part of an electrode layer included in the capacitive element; and a control circuit which converts video signals provided from outside into luminescent pixel signals that determine luminescence of the luminescent pixels and outputs the luminescent pixel signals to a driving circuit in scanning order, wherein the control circuit includes an incremental operation circuit which increases a luminescent pixel signal corresponding to the repaired luminescent pixel and outputs the increased luminescent pixel signal after reading only the coordinate information from the memory and comparing information of the video signals with the coordinate information in the scanning order, the capacitive element includes two electrode layers facing each other in a layer-stacking direction, one of the two electrode layers includes electrode block layers resulting from division of the electrode layer in a planer direction, the electrode block layers are connected through one or more conductive lines in a same plane, and the other one of the two electrode layers is a single plate formed in the planer direction in a region except a region on which the one or more conductive lines are projected in the layer-stacking direction.

With the image display device and modification method performed by the same according to an aspect of the present invention, it is possible to allow a repaired luminescent pixel having a capacitive element whose electrode layer has been partially cut off, to not only produce luminescence with the same luminescent timing as the other normal luminescent pixels but also produce luminescence with the same luminance as the normal luminescent pixels. This improves the display quality of the luminescent panel.

BRIEF DESCRIPTION OF THE DRAWINGS

These and other objects, advantages and features of the invention will become apparent from the following description thereof taken in conjunction with the accompanying drawings that illustrate a specific embodiment of the invention. In the Drawings:

FIG. 3 is a structural cross-section diagram of a luminescent pixel according to Embodiment 1 of the present invention;

FIG. 4 is an electrode structural diagram of a capacitive element included in an image display device according to Embodiment 1 of the present invention;

DESCRIPTION OF THE PREFERRED EMBODIMENT(S)

Figure 1:
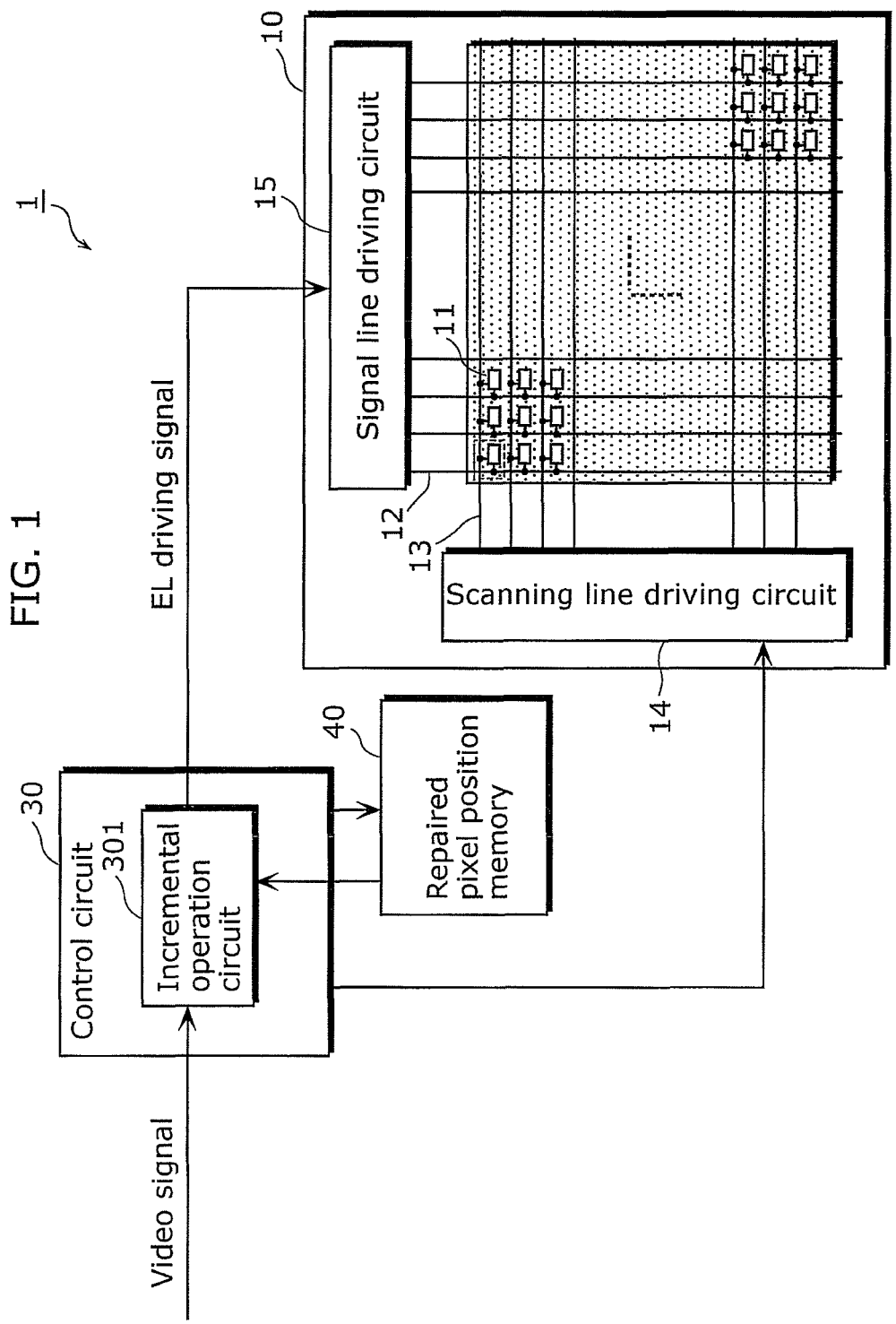
FIG. 1 is a functional block diagram showing a structure of an image display device according to Embodiment 1 of the present invention.

The image display device according to an implementation of the present invention is an image display device that includes a luminescent panel in which luminescent pixels are two-dimensionally arranged, each luminescent pixel having a stacked structure of a luminescent layer and a driving circuit layer which includes a capacitive element for driving the luminescent layer, the image display device including: a memory in which coordinate information of a repaired luminescent pixel in the luminescent panel is stored in advance, the repaired luminescent pixel including a capacitive element repaired through disconnection of part of an electrode layer included in the capacitive element; and a control circuit which converts video signals provided from outside into luminescent pixel signals that determine luminescence of the luminescent pixels and outputs the luminescent pixel signals to a driving circuit in scanning order, wherein the control circuit includes an incremental operation circuit which increases a luminescent pixel signal corresponding to the repaired luminescent pixel and outputs the increased luminescent pixel signal after reading only the coordinate information from the memory and comparing information of the video signals with the coordinate information in the scanning order, the capacitive element includes two electrode layers facing each other in a layer-stacking direction, one of the two electrode layers includes electrode block layers resulting from division of the electrode layer in a planer direction, the electrode block layers are connected through one or more conductive lines in a same plane, and the other one of the two electrode layers is a single plate formed in the planer direction in a region except a region on which the one or more conductive lines are projected in the layer-stacking direction.

With the above structure, it is possible to allow a repaired luminescent pixel having a capacitive element whose electrode layer which had caused a short circuit at the time of manufacturing has been partially cut off, to not only produce luminescence with the same luminescent timing as the other normal luminescent pixels but also produce luminescence with the same luminance as the normal luminescent pixels, by using only the coordinate information of the repaired luminescent pixel as modification data. This improves the display quality of the luminescent panel.

Furthermore, in the image display device according to an implementation of the present invention, it is preferable that the electrode block layers have the same shape in the respective luminescent pixels, and that in the case where parts of the electrode layers are conductive in the layer-stacking direction at time of manufacturing, disconnection of only one of the electrode block layers causes a capacitance of the repaired capacitive element to be reduced from a designed value at a predetermined rate.

With this, at least one of the electrode layers of the capacitive element has a structure in which electrode block layers are connected in the planar direction through one or more conductive lines, thereby making it possible to disconnect, from the capacitive element, an electrode block layer containing an unnecessary particle or the like through laser irradiation of the conductive lines. Moreover, since the other electrode layer is not formed in the region on which the region of the one or more conductive lines is projected in the layer-stacking direction, it is possible to prevent damage on the region of the capacitive element when the conductive lines are irradiated with a laser. As a result, although the capacitance is reduced by the area proportion of the disconnected electrode block layer, the capacitive element becomes capable of holding a voltage corresponding to a signal voltage provided through a corresponding data line and of causing the luminescent element to produce luminescence with proper luminescent timing. This improves the display quality of the luminescent panel.

Moreover, in the image display device according to an implementation of the present invention, the incremental operation circuit preferably increases the luminescent pixel signal corresponding to the repaired luminescent pixel with an amplification factor common to all repaired luminescent pixels, and outputs the increased luminescent pixel signal.

Inferring from the percent defective of luminescent pixels in the ordinary image display devices, the defectiveness in a luminescent pixel attributable to a capacitive element is predominantly caused by a short circuit at only one position. This means that the defectiveness in the luminescent pixel attributable to the capacitive element can be mostly solved by cutting off only a defective electrode block layer containing an unnecessary particle or the like. Therefore, in the case where the electrode block layers included in each luminescent pixel are formed with the same structure, it is possible for the capacitive elements of all the repaired luminescent pixels to have approximately the same capacitance.

This allows reduction in the load on the control circuit because it is possible to fix, regardless of luminescent pixels, the amplification factor used in increasing the luminescent pixel signals of the repaired luminescent pixels.

Furthermore, in the image display device according to an implementation of the present invention, coordinates of repaired luminescent pixels may be stored in the memory in the scanning order as the coordinate information, and the incremental operation circuit may include: a next repaired position register which, after a luminescent pixel signal corresponding to a first repaired luminescent pixel is output, reads the coordinate information stored in the memory to read only coordinates of a second repaired luminescent pixel that are stored next to coordinates of the first repaired luminescent pixel; a scan coordinate comparator which compares the coordinates of the second repaired luminescent pixel with coordinates of a current luminescent pixel for which a luminescent pixel signal is to be output; and an output increasing operator which increases the luminescent pixel signal of the current luminescent pixel and outputs the increased luminescent pixel signal when the comparison by the scan coordinate comparator shows a match between the coordinates of the second repaired luminescent pixel and the coordinates of the current luminescent pixel.

This eliminates the need to prepare a large-capacity memory for storing modification data of all the luminescent pixels. Furthermore, comparison, in the scanning order, between the coordinates of luminescent pixels for which luminescent pixel signals are to be output and the coordinates of repaired luminescent pixels stored in the memory allows modification of luminescent pixel signals of the repaired luminescent pixels, thereby enabling reduction in the load of processor processing by the control circuit.

In addition, in the image display device according to an implementation of the present invention, the numbers of scanned pixels, each of which is a relative number of scanned pixels from one repaired luminescent pixel to another repaired luminescent pixel which is to be scanned next to the one repaired luminescent pixel, may be stored in the memory in the scanning order as the coordinate information, and the incremental operation circuit may include: a next repaired position counting circuit which, after a luminescent pixel signal corresponding to a first repaired luminescent pixel is output, reads the coordinate information stored in the memory to read only the number of scanned pixels from the first repaired luminescent pixel to a second repaired luminescent pixel which is to be scanned next, and decrements the number of scanned pixels by one when a luminescent pixel signal of a current luminescent pixel for which a luminescent pixel signal is to be output is output without being increased; and an output increasing operator which increases the luminescent pixel signal of the current luminescent pixel and outputs the increased luminescent pixel signal when the number of scanned pixels read by the next repaired position counting circuit is one.

This eliminates the need to prepare a large-capacity memory for storing modification data of all the luminescent pixels. In addition, with the counting circuit that decrements the number of scanned pixels between repaired luminescent pixels every time a scan is performed, it is possible to modify a luminescent pixel signal of a repaired luminescent pixel with simple logic processing, thereby allowing reduction in the load on the control circuit.

Moreover, in the image display device according to an implementation of the present invention, the memory may have, as a main storage region, a storage region for storing data other than the coordinate information.

Since it is a small percentage of luminescent pixels that include a capacitive element short-circuited between electrodes at the time of manufacturing, the memory for storing the coordinate information of repaired luminescent pixels does not require a large capacity. It is therefore unnecessary to prepare a memory separately for this purpose, and the function of the memory according to an implementation of the present invention can be achieved by using available space of a nonvolatile memory or the like originally included in the image display device. This enables cost reduction.

Furthermore, in the image display device according to an implementation of the present invention, the capacitive element is preferably a capacitive element which holds, as a held voltage, a voltage corresponding to a luminescent pixel signal provided for a corresponding luminescent pixel, the driving circuit layer preferably further includes a driving transistor which has a gate connected to one of terminals of the capacitive element and converts the held voltage into a signal current that is a source-to-drain current when the held voltage is applied to the gate, and the luminescent layer preferably includes a luminescent element which produces luminescence when the signal current flows.

The present invention can be realized not only as the image display device including such characteristic elements, but also as a modification method performed by the image display device including the characteristic elements of the image display device as steps.

Hereinafter, embodiments of the present invention are described with reference to the drawings. Note that the same constituent elements are given the same numerical references throughout the embodiments and drawings. Furthermore, described hereinafter as an example is an image display device which includes an upper-surface-luminescent organic EL element having the anode as the lower surface and the cathode as the upper surface.

Embodiment 1

In the image display device of the present embodiment, a driving circuit layer which drives a luminescent layer includes a capacitive element that is previously repaired through disconnection of part of an electrode layer. The image display device includes: a memory in which coordinate information of a repaired luminescent pixel in a luminescent panel is stored, the repaired luminescent pixel including the repaired capacitive element; and a control circuit which converts video signals into luminescent pixel signals that determine luminescence of luminescent pixels and outputs the luminescent pixel signals in scanning order. Here, the control circuit includes an incremental operation circuit which increases a luminescent pixel signal corresponding to the repaired luminescent pixel and outputs the increased luminescent pixel signal after reading only the coordinate information from the memory and comparing information of the video signals with the coordinate information in the scanning order. This makes it possible to allow the repaired luminescent pixel to not only produce luminescence with the same luminescent timing as the other normal luminescent pixels but also produce luminescence with the same luminance as the normal luminescent pixels, by using only the coordinate information of the repaired luminescent pixel as modification data. This improves the display quality of the luminescent panel.

Hereinafter, embodiments of the present invention are described with reference to the drawings.

FIG. 1 is a functional block diagram showing a structure of the image display device according to Embodiment 1 of the present invention. An image display device 1 shown in FIG. 1 includes a luminescent panel 10, a control circuit 30, and a repaired pixel position memory 40. The luminescent panel 10 includes luminescent pixels 11, signal lines 12 each provided for a corresponding column of the luminescent pixels, scanning lines 13 each provided for a corresponding row of the luminescent pixels, a scanning line driving circuit 14, and a signal line driving circuit 15.

The control circuit 30 includes an incremental operation circuit 301.

The luminescent pixels 11 are two-dimensionally arranged on the luminescent panel 10.

The scanning line driving circuit 14 drives circuit elements of the luminescent pixels with predetermined driving timing by providing scanning signals to the scanning lines 13.

The signal line driving circuit 15 causes luminescent pixels to produce luminescence according to video signals, by providing a luminescent pixel signal and a reference signal to the signal lines 12.

The control circuit 30 converts video signals received from outside into luminescent pixel signals that determine the luminescence of the luminescent pixels, and provides the luminescent pixel signals to the signal line driving circuit 15 in scanning order.

Furthermore, the control circuit 30 controls timing when the signal line driving circuit 15 provides the luminescent pixel signals and timing when the scanning line driving circuit 14 provides the scanning signals.

Furthermore, the control circuit 30 increases a luminescent pixel signal of a repaired luminescent pixel whose capacitive element is repaired using a later-described technique, and outputs the increased luminescent pixel signal to the signal line driving circuit 15. More specifically, the incremental operation circuit 301 increases luminescent pixel signals corresponding to repaired luminescent pixels and outputs the increased luminescent pixel signals after reading only coordinate information from the repaired pixel position memory 40 in which information on pixel coordinates of the repaired luminescent pixels in the luminescent panel 10 are stored in the scanning order, and comparing information of the video signals with the coordinate information in the scanning order. The structure and operation of the incremental operation circuit 301 are further described later.

Next, the structure and function of each luminescent pixel 11 are described.

Figure 2:
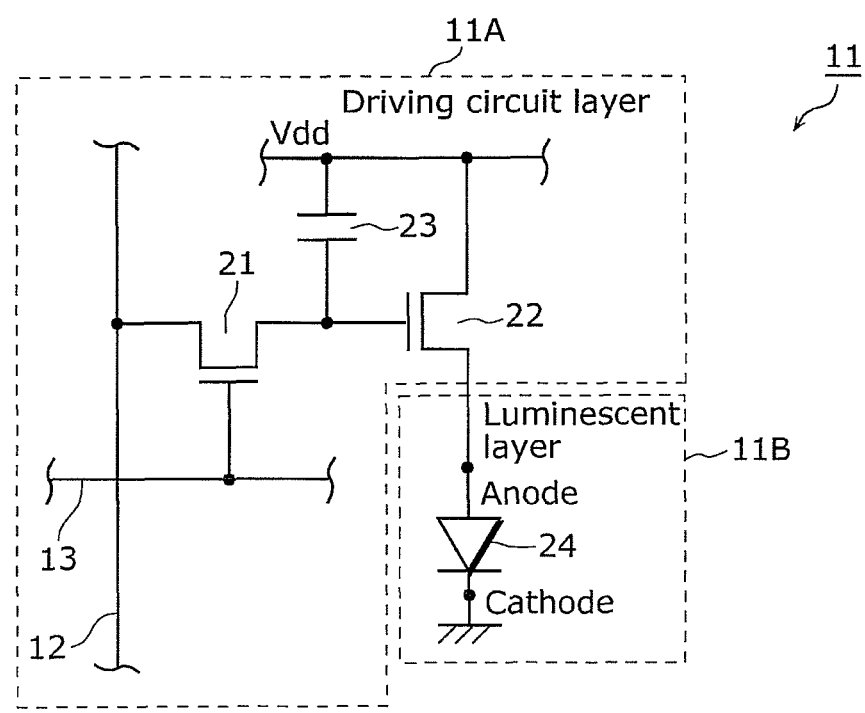
FIG. 2 is a main circuit configuration diagram of a luminescent pixel according to Embodiment 1 of the present invention.

FIG. 2 is a main circuit configuration diagram of a luminescent pixel according to Embodiment 1 of the present invention. The luminescent pixel 11 shown in FIG. 2 includes a driving circuit layer 11A and a luminescent layer 11B. The driving circuit layer 11A includes a switching transistor 21, a driving transistor 22, and a capacitive element 23, for example. The drain electrode of the switching transistor 21 is connected to a corresponding signal line 12, the gate electrode of the switching transistor 21 is connected to a corresponding scanning line 13, and the source electrode of the switching transistor 21 is connected to the capacitive element 23 and the gate electrode of the driving transistor 22. Furthermore, the drain electrode of the driving transistor 22 is connected to a power source Vdd, and the source electrode is connected to the anode of the luminescent layer 11B.

With this configuration, when a scanning signal is provided to the scanning line 13 and the switching transistor 21 is thus turned on, a signal voltage supplied through the signal line 12 is held in the capacitive element 23. Then, the voltage in the capacitive element 23 is held throughout one frame period, and with this held voltage, the conductance of the driving transistor 22 changes in an analog manner, and a driving current corresponding to a luminescent level is supplied to the anode of the luminescent layer 11B. Furthermore, the driving current supplied to the anode of the luminescent layer 11B flows into an organic EL element 24 and the cathode of the luminescent layer 11B. With this, the organic EL element 24 of the luminescent layer 11B produces luminescence and an image is displayed.

Note that the driving circuit layer 11A is not limited to the above circuit configuration. That is to say, although the switching transistor 21, the driving transistor 22, and the capacitive element 23 are the essential constituent elements of the circuit for passing, to the luminescent layer 11B, a driving current corresponding to a value of a signal voltage, they are not limited to the above configuration. Moreover, the driving circuit layer 11A according to an implementation of the present invention may also include another circuit constituent element in addition to the above circuit constituent elements.

FIG. 3 is a structural cross-section diagram of a luminescent pixel according to Embodiment 1 of the present invention. The luminescent pixel 11 shown in FIG. 3 includes a substrate 100, the driving circuit layer 11A, the luminescent layer 11B, and a transparent sealing film 110.

The substrate 100 is a glass substrate, for example. The substrate 100 may also be a flexible substrate made of a resin. The substrate 100 functions also as a thin-film transistor (TFT) substrate. Note that in the case of a top-emission structure as shown in FIG. 3, the substrate 100 does not have to be transparent, and thus a non-transparent substrate such as a silicon substrate may also be used.

The driving circuit layer 11A includes the driving transistor 22 formed on the substrate 100, the capacitive element 23, planarizing films 101 and 102, and the switching transistor 21 which is not shown.

The driving transistor 22 is a TFT formed on the substrate 100. The driving transistor 22 includes a drain electrode 220, a source electrode 221, a semiconductor layer 222 formed in contact with the source electrode 221 and the drain electrode 220, a gate insulating film 223 formed on the semiconductor layer 222, and a gate electrode 224 formed on the gate insulating film 223.

The capacitive element 23 is a parallel-plate capacitive element sandwiched between electrode layers 231 and 232 facing each other in the layer-stacking direction. The electrode layer 231 is connected to the gate electrode 224 in the driving circuit layer 11A. The electrode layer 232 is connected to the power source Vdd. The electrode layer 231 is made of an alloy of molybdenum (Mo) and tungsten (W), for example, and has a thickness of 150 nm, for example. The electrode layer 232 has a stacked structure including: an alloy of Mo and W; aluminum (Al); and an alloy of Mo and W, for example, and has a total thickness of 150 nm, for example.

An insulating layer 233 is formed between the electrode layers 231 and 232. The insulating layer 233 is a silicon oxide film (SiOx) or a silicon nitride film (SiN), for example. The insulating layer 233 has a thickness of 150 nm, for example. Note that the insulating layer 233 may be a dielectric material to ensure a desired capacitance.

Although not shown in this structural cross-section diagram, the switching transistor 21 is formed in the driving circuit layer with a structure similar to that of the driving transistor 22. To implement the circuit configuration diagram of FIG. 2, the gate electrode 224 of the driving transistor 22 and the source electrode of the switching transistor 21 are electrically connected through a wire not shown.

The planarizing films 101 and 102 are formed on and above the substrate 100 to cover the above-described switching transistor 21, driving transistor 22, and capacitive element 23.

The upper surface of the driving circuit layer 11A is planarized through the planarizing film 102. Note that the planarizing films 101 and 102 are made of a silicon oxide film formed by CVD (chemical vapor deposition) or sputtering, for example. The planarizing films 101 and 102 are formed by planarizing the surface of this silicon oxide film by chemical mechanical polishing (CMP), for example.

The luminescent layer 11B includes an anode 103, a hole injection layer 104, a hole transport layer 105, an organic luminescent layer 106, a bank layer 107, an electron injection layer 108, and a transparent cathode 109.

The luminescent pixel 11 shown in FIG. 3 has a top-emission structure. That is to say, when a voltage is applied to the luminescent layer 11B, the organic luminescent layer 106 produces luminescence and the luminescence travels upward through the transparent cathode 109 and the transparent sealing film 110. The luminescence produced by the organic luminescent layer 106 and traveled downward is reflected by the anode 103 and travels upward through the transparent cathode 109 and the transparent sealing film 110.

The anode 103 is an electrode which is stacked on the surface of the planarizing film 102 of the driving circuit layer 11A and applies, to the luminescent layer 11B, a positive voltage with reference to the transparent cathode 109. The anode 103 and the source electrode 221 of the driving transistor 22 are connected through a via formed in the driving circuit layer 11A. The anode material of the anode 103 is preferably one of Al and Ag which are highly reflective metals, or an alloy thereof, for example. The anode 103 has a thickness of 100 to 300 nm, for example.

The hole injection layer 104 is formed on the surface of the anode 103 and has a function to inject holes into the organic luminescent layer 106 stably or by assisting generation of holes. With this, the driving voltage of the luminescent layer 11B is lowered, allowing a longer operating life for the organic EL element through the stable hole injection. The hole injection layer 104 can be made of PEDOT (polyethylenedioxythiophene), for example. Other than being required to inject holes, the hole injection layer 104 is also required to be light transmissive. The reflectance of the hole injection layer 104 decreases as the thickness of the hole injection layer 104 increases, and therefore the thickness of the hole injection layer 104 is preferably 10 nm to 100 nm approximately, for example.

The hole transport layer 105 is formed on the surface of the hole injection layer 104, and has functions to efficiently transport, into the organic luminescent layer 106, the holes injected by the hole injection layer 104, prevent deactivation of excitons in the interface between the organic luminescent layer 106 and the hole injection layer 104, and block electrons. The hole transport layer 105 is an organic polymeric material having a property of transmitting the generated holes by a reaction of charge transfer between molecules, and is triphenylamine, polyaniline, or the like. The hole transport layer 105 has a thickness of 5 to 50 nm approximately, for example. When the organic luminescent layer 106, which is a layer on the hole transport layer 105, is to be formed, a cross linker is preferably included in the hole transport layer 105 so that the hole transport layer 105 does not easily elute into the organic luminescent layer 106.

Note that the hole transport layer 105 is sometimes omitted due to the materials of the hole injection layer 104 and the organic luminescent layer 106 that are adjacent to the hole transport layer 105.

The organic luminescent layer 106 is formed on the surface of the hole transport layer 105, and has a function to produce luminescence when an excited status is generated through recombination of the injected holes and electrons.

The organic luminescent layer 106 is preferably made of a luminescent organic material which can be formed by a wet film-forming method such as an ink-jet process or spin-coating. This enables easy and uniform film formation on a substrate of a large screen. The material of the organic luminescent layer 106 is not particularly limited, but is preferably an organic polymeric material. The characteristics of the organic polymeric material are that it allows a simple device structure, achieves a high film reliability, allows a device to be driven with a low voltage, and so on.

Since polymers having a conjugated system such as an aromatic ring or a condensed ring and pi-conjugated polymers are fluorescent, they can be used as the organic polymeric material of the organic luminescent layer 106. As a luminescent polymeric material of the organic luminescent layer 106, there are polyphenylene vinylene (PPV) or a derivative thereof (PPV derivative), polyfluorene (PFO) or a derivative thereof (PFO derivative), or a polyspiro-fluorene derivative may be used, for example. Polythiophene or a derivative thereof can also be used.

The bank layer 107 is formed on the surface of the hole injection layer 104 and functions as a bank so that the hole transport layer 105 and the organic luminescent layer 106, which are formed using a wet film-forming method, are deposited in a predetermined region. The material used for the bank layer 107 may be either of an inorganic substance and an organic substance; however, an organic substance is more preferably used since it is generally highly water-repellent. Examples of such material include a polyimide resin and a polyacrylic resin. The method of patterning the bank layer 107 is not limited to anything in particular, but photolithography using a photosensitive material is preferably used. The bank layer 107 has a thickness of 100 to 3000 nm, for example.

The electron injection layer 108 is formed on the organic luminescent layer 106 and has functions to reduce barriers of the electron injection into the organic luminescent layer 106, lower the driving voltage of the luminescent layer 11B, and suppress the deactivation of excitons. This makes it possible to increase the operating life of the organic EL element through stable electron injection and to reduce element defects through enhanced uniformity of the luminescent surface brought about by strengthened contact with the transparent cathode 109. Although it is not limited to anything in particular, the electron injection layer 108 is preferably made of barium, aluminum, phthalocyanine, lithium fluoride, a laminate of barium and aluminum, or the like. The electron injection layer 108 has a thickness of 2 to 50 nm, for example.

The transparent cathode 109 is stacked on the surface of the electron injection layer 108 and has a function to apply, to the luminescent layer 11B, a negative voltage with reference to the anode 103 and to inject electrons into the organic EL element (the organic luminescent layer 106 in particular). Although it is not limited to anything in particular, a highly transmissive substance and structure are preferably used for the transparent cathode 109. This makes it possible to provide a top-emission organic EL element with high luminescent efficiency. Although it is not limited to anything in particular, a metal oxide layer is used for the transparent cathode 109. Although it is not limited to anything in particular, a layer made of indium tin oxide (ITO) or indium zinc oxide (IZO) is used as the metal oxide layer. The transparent cathode 109 has a thickness of 5 to 200 nm, for example.

The transparent sealing film 110 is formed on the surface of the transparent cathode 109 and has a function to protect the organic EL element from moisture. The transparent sealing film 110 is required to be transparent. The transparent sealing film 110 is made of SiN, SiON, or an organic film, for example, and has a thickness of 20 to 5000 nm, for example.

With the above structure of each luminescent pixel 11, the image display device 1 functions as an active-matrix display device.

Next, the structure and function of the capacitive element 23, a constituent element of the present invention, are described. FIG. 4 is an electrode structural diagram of a capacitive element included in the image display device according to Embodiment 1 of the present invention. FIG. 4 shows top views of the electrode layers 231 and 232 facing each other in the layer-stacking direction and a top perspective view of the capacitive element 23 formed by vertical overlapping of the electrode layers. Although it is not shown, the insulating layer 233 is formed between the electrode layers 231 and 232.

The electrode layer 232 formed as the upper layer includes four electrode block layers 232A to 232D resulting from division of the electrode layer 232 in the planar direction. The electrode block layers 232A to 232D are connected in the same plane through conductive lines 234.

The electrode layer 231 formed as the lower layer is formed in a region except regions R on which the conductive lines 234 are projected in the layer-stacking direction. In other words, the electrode layer 231 is not formed in the regions R facing the conductive lines 234. In the present embodiment, the regions R are formed by design in the region of the electrode layer 231. When the conductive lines 234 formed on the surface of the electrode layer 232 are irradiated with a laser, it is expected that the laser reaches the surface of the electrode layer 231 and damages the electrode layer 231. However, the regions R are larger than the regions in which the laser reaches the surface of the electrode layer 231 and damages that surface.

With the above structure of the capacitive element 23, the laser irradiation of the conductive lines 234 makes it possible to disconnect, from the capacitive element, an electrode block layer causing a short circuit between electrodes due to the presence of an unnecessary particle or the like. Furthermore, the electrode layer 231 is not formed in the regions R facing the conductive lines 234. Accordingly, when the conductive lines 234 are irradiated with a laser from a direction approximately perpendicular to the electrode layer 232, the laser might reach the regions R but does not damage the region forming the capacitive element, i.e. the electrode layer 231.

The top perspective view in FIG. 4 shows a feeder line which connects the electrode layer 232 and other circuit elements. The feeder line is connected to the four electrode block layers 232A to 232D through the conductive lines 234.

Inferring from the percent defective of luminescent pixels in the ordinary image display devices, the defectiveness in a luminescent pixel attributable to a capacitive element is predominantly caused by a short circuit at only one position. This means that the defectiveness in the luminescent pixel attributable to the capacitive element can be mostly solved by cutting off only one electrode block layer containing an unnecessary particle or the like. Thus, with the connection of the feeder line, only one of the electrode block layers 232A to 232D can be electrically insulated from the other electrode block layers and the feeder line. Furthermore, the electrical disconnection of only one of the electrode block layers 232A to 232D does not cause disconnection of the feeder line from the other electrode block layers functioning normally. Thus, the repaired capacitive element functions as a capacitor of the luminescent pixel.

Figure 5A:
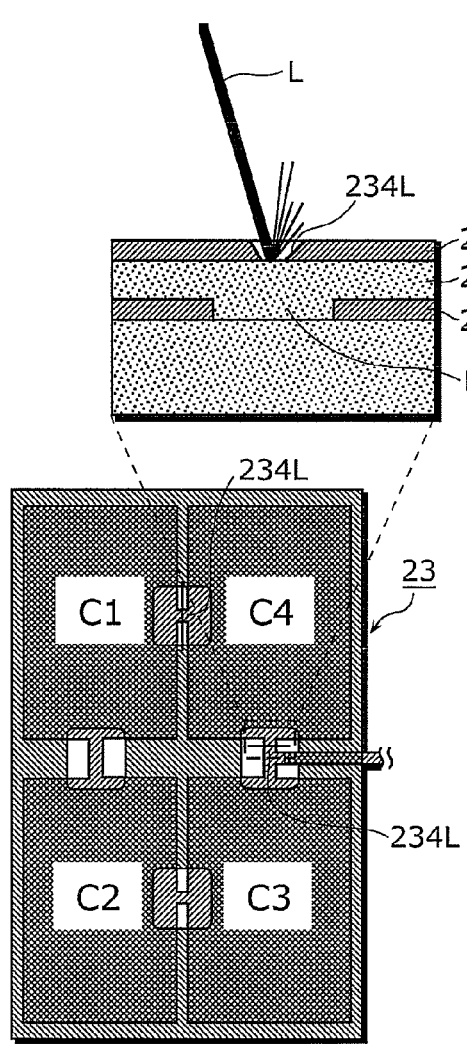
FIG. 5A is a diagram showing how a capacitive element according to Embodiment 1 of the present invention is irradiated with a laser to disconnect a predetermined electrode block layer.

FIG. 5A is a diagram showing how the capacitive element according to Embodiment 1 of the present invention is irradiated with a laser to disconnect a predetermined electrode block layer. As shown in FIG. 5A, the capacitive element 23 is divided into electrode blocks C1 to C4. Here, in the case where, for example, a short circuit of the electrode block C4 is caused by uneven distribution of conductive particles or the like in the insulating layer of the electrode block C4 throughout the upper and lower electrode block layers, the charge that should be accumulated in the capacitive element 23 through the voltage applied between the electrode layers 231 and 232 is not held due to a current path formed in the electrode block C4.

Figure 5B:
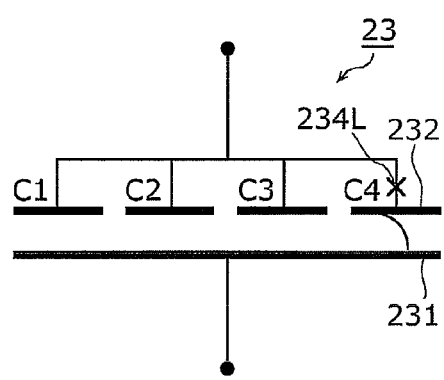
FIG. 5B is an equivalent circuit diagram of a capacitive element according to Embodiment 1 of the present invention.

FIG. 5B is an equivalent circuit diagram of the capacitive element according to Embodiment 1 of the present invention.

In the case where the electrode block C4 is not short-circuited, the capacitance of the capacitive element 23 is a value obtained by adding up the capacitances of all the electrode blocks. Here, as shown in FIG. 5B, in the case where both the electrode block layer and the electrode layer of the electrode block C4 are short-circuited, the electrode block C4 can be disabled by electrically isolating it from the capacitive element 23 serving as a capacitive element. More specifically, in the top perspective view of the capacitive element 23 shown in the lower half of FIG. 5A, two conductive lines 234L connected to the electrode block C4 are irradiated with a laser from a direction approximately perpendicular to the film surface. In the upper half of FIG. 5A, L denotes a path of a laser beam, and the conductive line 234L is disconnected by the laser beam.

With this, the electrode block layer 232D equivalent to the electrode block C4 in the electrode layer 232 formed as the upper layer is electrically insulated from the other regions of the electrode layer 232. Furthermore, at this point in time, the electrode layers and the insulating layer involved in the capacitance holding function are not damaged because electrodes included in the capacitive element are not formed in the regions on which the conductive lines 234L are projected in the layer-stacking direction (the regions R in FIG. 4).

The laser irradiation enables the capacitive element 23 to normally function as a capacitive element having the electrode blocks C1 to C3 connected in parallel.

Thus, although the capacitance value is reduced by the area proportion of the disconnected electrode block C4, the capacitive element 23 becomes capable of holding a voltage corresponding to a signal voltage provided through a corresponding signal line and of causing the luminescent layer 11B to produce luminescence with proper luminescent timing.

Note that although this is an example of processing the electrode layer 232 formed as the upper layer, the laser processing may be performed on the electrode layer 231 formed as the lower layer, with the patterns of the electrode layers 231 and 232 reversed.

Figure 5C:
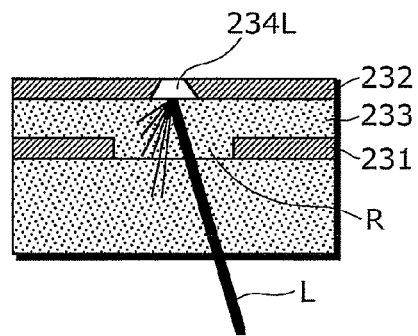
FIG. 5C is a structural cross-section diagram for explaining the case where a capacitive element according to Embodiment 1 of the present invention is irradiated with a laser from the lower surface side.

Furthermore, the laser may be emitted from the lower surface of the luminescent panel 10 via the substrate 100, instead of the upper surface. FIG. 5C is a structural cross-section diagram for explaining the case where the capacitive element according to Embodiment 1 of the present invention is irradiated with a laser from the lower surface side. Compared with the laser irradiation from the upper surface as shown in FIG. 5A, the laser irradiation from the lower surface shown in FIG. 5C is beneficial in repairing the capacitive element 23 after forming the luminescent layer 11B on the driving circuit layer 11A. This is because the laser irradiation from the lower surface does not allow the laser to pass through the luminescent layer 11B and thus can eliminate the possibility of damaging the luminescent layer 11B with the laser passing through.

Next, a manufacturing method of the image display device according to Embodiment 1 of the present invention is described. The manufacturing method of the image display device 1 according to an implementation of the present invention is different from a manufacturing method of a conventional image display device only in the process of forming the capacitive element 23. Hereinafter, descriptions of the aspects common to the manufacturing method of the conventional image display device are omitted, and only the different aspects are described.

First, as a layer of the driving circuit layer 11A, the electrode layer 231 made of an alloy of Mo and W, for example, is formed at a predetermined position using a technique such as metal-mask film formation, liftoff technique, or etching.

Here, the electrode layer 231 and the gate electrode of the switching transistor 21 are connected through a metal line.

Next, the insulating layer 233 made of SiOx or SiN, for example, is formed on the electrode layer 231 to cover the electrode layer 231. Here, the surface of the insulating layer 233 is preferably flattened as necessary.

Next, on the insulating layer 233, the electrode layer 232 having a stacked structure including: an alloy of Mo and W; Al; and an alloy of Mo and W, for example, is formed at a predetermined position using a technique such as metal-mask film formation, liftoff technique, or etching. Here, the planar pattern of the electrode layer 232 is such that the electrode layer 232 is divided into electrode block layer regions that are connected in the same plane through conductive lines.

Here, the electrode layer 231 formed as the lower layer is formed in a region except regions on which the conductive lines 234 are projected in the layer-stacking direction. More specifically, the electrode layer 231 is formed using the above patterning technique so that the regions R shown in FIG. 4 are included in the inner region of the electrode layer 231.

With the above manufacturing method, the capacitive element 23 is formed in the driving circuit layer 11A.

With the above manufacturing method of the image display device 1, the laser irradiation of the conductive lines makes it possible to disconnect, from the capacitive element, an electrode block layer containing an unnecessary particle or the like. Furthermore, it is possible to prevent the region of the capacitive element from being damaged by the laser irradiation of the conductive lines because electrodes included in the capacitive element are not formed in the regions on which the conductive lines 234 are projected in the layer-stacking direction (the regions R in FIG. 4).

Figure 6:
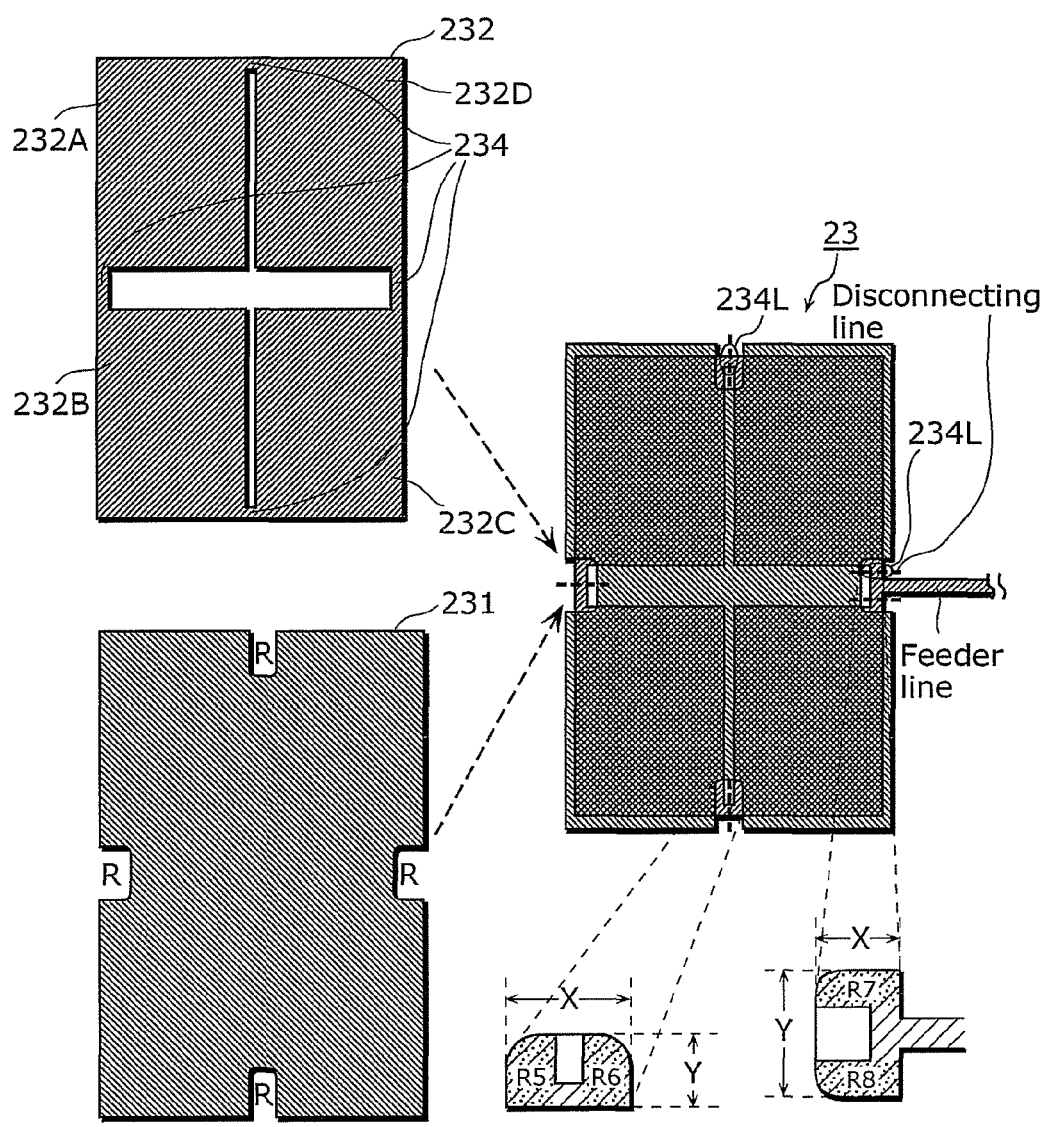
FIG. 6 is an electrode structural diagram of a capacitive element showing a first variation according to Embodiment 1 of the present invention.

FIG. 6 is an electrode structural diagram of a capacitive element showing a first variation according to Embodiment 1 of the present invention. As in FIG. 4, FIG. 6 shows top views of the electrode layers 231 and 232 facing each other in the layer-stacking direction and a top perspective view of the capacitive element 23 formed by vertical overlapping of the electrode layers. Although it is not shown, the insulating layer 233 is formed between the electrode layers 231 and 232. Compared with the capacitive element shown in FIG. 4, the capacitive element 23 of FIG. 6 is different in positions of the conductive lines 234. Hereinafter, the descriptions of the aspects common to the capacitive element shown in FIG. 4 are omitted, and only the different aspects are described.

The conductive lines 234 are provided within, and on the outer periphery of, the electrode layer 232, and connect the electrode block layers.

The electrode layer 231 formed as the lower layer is formed in a region except regions R on which the conductive lines 234 are projected in the layer-stacking direction. In other words, the electrode layer 231 is by design not formed in the regions R facing the conductive lines 234. In the present embodiment, the regions R are formed within, and on the edges of the electrode layer 231.

With the structure of the capacitive element 23 in this variation, the laser irradiation of the conductive lines 234 makes it possible to disconnect, from the capacitive element, an electrode block layer containing an unnecessary particle or the like. In addition, since the electrode layer 231 is not formed in the regions R, it is possible to prevent the region forming the capacitive element, i.e. the electrode layer 231, from being damaged by the laser irradiation of the conductive lines 234 from a direction approximately perpendicular to the surface of the electrode layer 232.

In this variation, a feeder line is shown which connects the electrode layer 232 and other circuit elements. The feeder line is connected to the four electrode block layers 232A to 232D through the conductive lines 234. Thus, with the connection of the feeder line, only one of the electrode block layers 232A to 232D can be electrically insulated from the other electrode block layers and the feeder line. Furthermore, the electrical disconnection of only one of the electrode block layers 232A to 232D does not cause disconnection of the feeder line from the other electrode block layers functioning normally. Thus, the repaired capacitive element functions as a capacitor of the luminescent pixel.

Also in this variation, in the case where, for example, a short circuit is caused by the electrode block C4 (upper right electrode block in the top perspective view in FIG. 6), the laser irradiation of the conductive lines 234L connected to the electrode block C4 enables the capacitive element 23 to normally function as a capacitive element having the electrode blocks C1 to C3 connected in parallel.

Thus, although the capacitance value is reduced by the area proportion of the disconnected electrode block C4, the capacitive element 23 becomes capable of holding a voltage corresponding to a signal voltage provided through a corresponding signal line and of causing the luminescent layer 11B to produce luminescence with proper luminescent timing.

Compared with the capacitive element shown in FIG. 4, the capacitive element 23 in this variation has high area efficiency for capacitance to be ensured. Hereinafter, this advantageous effect is described.

The top perspective view of the capacitive element in FIG. 6 shows enlarged views of parts where a region R and a conductive line 234 are overlapped. To prevent the electrode layer 231 from being damaged by the laser irradiation of the conductive lines 234, and in light of pattern-mask misalignment in the process of aligning the regions R and the conductive lines 234, the regions R provided at the left and right ends of the electrode layer 231 are formed with X=8 μm and Y=12 μm, for example. The regions R provided at the top and bottom ends of the electrode layer 231 are formed with X=12 μm and Y=8 μm, for example. Here, the conductive lines 234 are assumed to be 4 μm in line width and 4 μm in length. More specifically, in order to disconnect the conductive lines 234 through laser irradiation, the regions R provided at the left and right ends of the electrode layer 231 include not only a region corresponding to the line width of the conductive lines 234 but also a region including regions R7 and R8 (X=4 μm, Y=12 μm), and the regions R provided at the top and bottom ends of the electrode layer 231 include not only a region corresponding to the line width of the conductive lines 234 but also a region including regions R5 and R6 (X=12 μm, Y=4 μm). Here, the regions facing the regions R5 to R8 that are constituent elements of the electrode blocks and are not the conductive lines 234 are in the regions R, and thus the regions R5 to R8 do not function as a capacitor.

The top perspective view of the capacitive element in FIG. 4 also shows enlarged views of parts where a region R and a conductive line 234 are overlapped. To prevent the electrode layer 231 from being damaged by the laser irradiation of the conductive lines 234, and in light of pattern-mask misalignment in the process of aligning the regions R and the conductive lines 234, the regions R provided in the lateral direction of the electrode layer 231 are formed with X=12 μm and Y=12 μm, for example. The regions R provided in the longitudinal direction of the electrode layer 231 are formed with X=12 μm and Y=12 μm, for example. Here, the conductive lines 234 are assumed to be 4 μm in line width. More specifically, in order to disconnect the conductive lines 234 through laser irradiation, the regions R provided in the lateral direction of the electrode layer 231 include not only a region corresponding to the line width of the conductive lines 234 but also, on both sides of the conductive lines 234, a region of X=4 μm and Y=12 μm, and the regions R provided in the longitudinal direction of the electrode layer 231 include not only a region corresponding to the line width of the conductive lines 234 but also, on both sides of the conductive lines 234, a region of X=12 μm and Y=4 μm. Here, the regions facing regions R1 to R4 that are constituent elements of the electrode blocks and are not the conductive lines 234 are in the regions R, and thus the regions R1 to R4 do not function as a capacitor.

The above comparison shows that the regions R5 and R6 facing the regions R formed in the capacitive element shown in FIG. 6 are respectively smaller than the regions R1 and R2 facing the regions R formed in the capacitive element shown in FIG. 4. Likewise, the regions R7 and R8 are smaller than the regions R3 and R4, respectively. This means that the capacitive element 23 shown in FIG. 6 can reduce, to a greater extent, the electrode layer area occupied for the regions R and thus has higher area efficiency for capacitance to be ensured, with respect to the area of the electrode layer 232 that includes the electrode block layers.

That is to say, it is preferable to form the conductive lines 234 on the outer edges of the electrode layer 232 rather than in the inner region of the electrode layer 232. The regions R formed according to the positions of the conductive lines 234 to prevent the electrode layer 231 from being damaged by the laser irradiation are preferably formed on the outer edges of the electrode layer 231 rather than in the internal region of the electrode layer 231.

Furthermore, as compared with the structure of the capacitive element shown in FIG. 4, the structure of the capacitive element in this variation allows shortening of the feeder line because the conductive lines to be laser-irradiated are formed on the outer edges of the electrode layer 232. This allows suppression of delay in charge and discharge performed through the feeder line, thereby enhancing the characteristics for charging and discharging signal charge.

Note that although this variation has also shown an example of processing the electrode layer 232 formed as the upper layer, the laser processing may be performed on the electrode layer 231 formed as the lower layer, with the patterns of the electrode layers 231 and 232 reversed.

Furthermore, the laser may be emitted from the lower surface of the luminescent panel 10 via the substrate 100, instead of the upper surface.

Next, a method of repairing the capacitive element 23 included in the image display device 1 is described.

Figure 7:
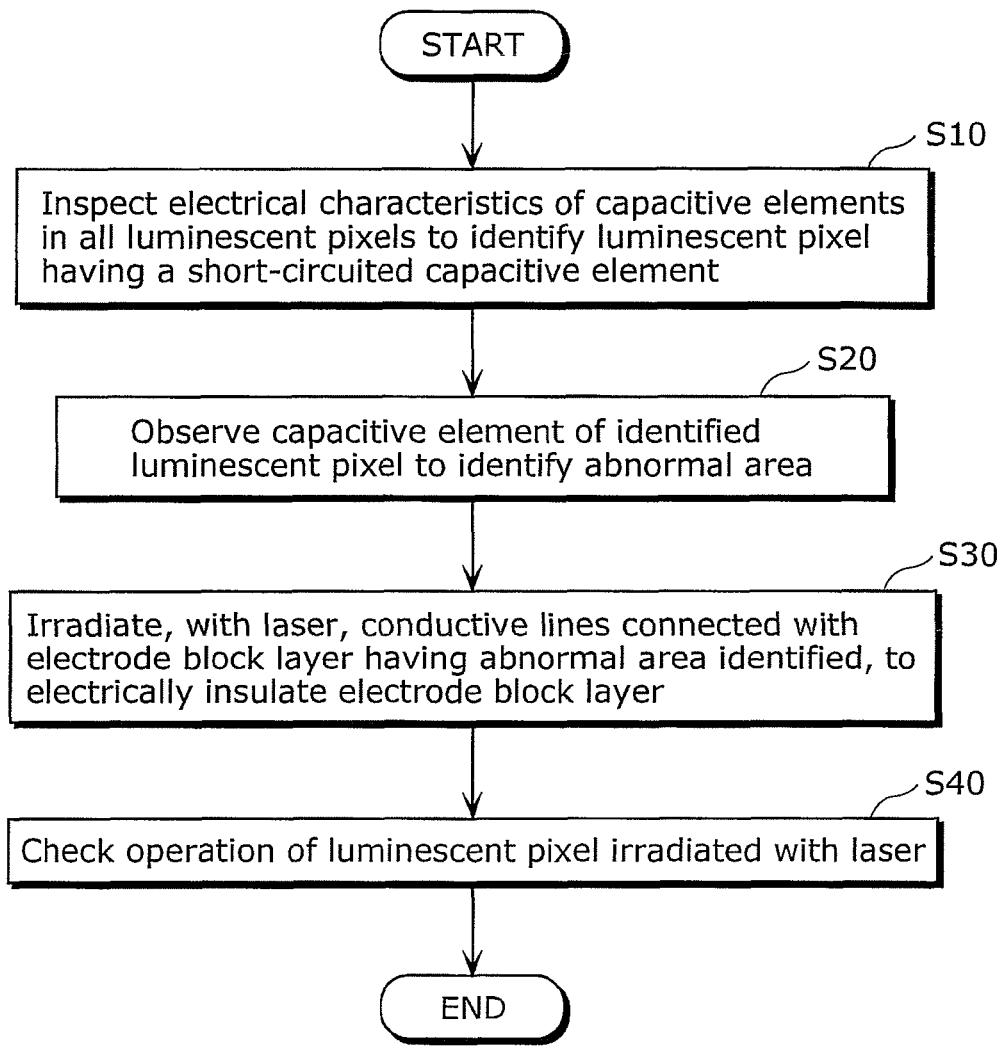
FIG. 7 is an operating flowchart showing a method of repairing a capacitive element included in an image display device according to Embodiment 1 of the present invention.

FIG. 7 is an operating flowchart showing a method of repairing a capacitive element included in the image display device according to Embodiment 1 of the present invention.

First, the electrical characteristics of the capacitive elements 23 in all the luminescent pixels 11 are inspected to identify a luminescent pixel 11 having a short-circuited capacitive element 23 (S10). More specifically, for example, an array tester (Agilent: HS100) is connected to the signal lines 12 and a test voltage is applied to the luminescent pixels 11 sequentially through the signal lines 12 such that the test voltage is held in the capacitive elements 23. After that, with predetermined timing, the array tester reads the voltage held in the capacitive elements 23, through the signal lines 12. With this, a luminescent pixel 11 is identified whose read-out voltage is lower than a predetermined voltage. This completes the process of identifying a luminescent pixel having an abnormal capacitive element 23.

Next, the capacitive element 23 of the identified luminescent pixel 11 is observed to identify an abnormal area (S20). More specifically, for example, the area in which the capacitive element 23 is formed is microscopically observed to examine whether there is any projection or depression on the surface. The area with uneven distribution of conductive particles usually has a projection. This completes the process of identifying the area of the abnormal capacitive element 23, and an abnormal electrode block layer is identified.

Note that this area identifying process may be performed by an inspecting person or by an automatic measurement system having an image recognition function.

Next, part of the conductive lines 234 connected with the electrode block layer having the identified abnormal area is irradiated with a laser to electrically insulate the electrode block layer from the other electrode block layers (S30). Here, the shape of the conductive lines 234 disconnectable by the laser irradiation of part thereof is closely related to the specifications of the laser used. For example, in the case where a laser oscillator having a yttrium aluminum garnet (YAG) laser as the light source is used with a laser having an output parameter of 532 nm in wavelength, 10 ns in pulse width, and 0.5 mW in power, for example, the conductive lines 234 can be disconnected without damaging the other normal electrode block layers, provided that the conductive lines 234 are 4 μm in width and 150 nm in thickness. Here, the conductive lines 234 have the above-described stacked structure including: an alloy of Mo and W; aluminum (Al); and an alloy of Mo and W, for example.

Lastly, the operation of the luminescent pixel 11 irradiated with the laser as above is checked (S40).

With the above operation, the luminescent pixel which has been abnormally operating at the time of the capacitive element formation becomes capable of holding a voltage corresponding to a signal voltage provided through a corresponding signal line and of causing the luminescent element to produce luminescence with proper luminescent timing. This improves the display quality of the luminescent panel.

Note that the method of repairing the capacitive element 23 described in FIG. 7 is performed during or after the process of manufacturing the image display device 1. For example, as for the image display device 1 shown in FIG. 3, the repairing method may be performed when the electrode layer 232 is formed as the upper layer, when the planarizing film 102 is formed, or when the luminescent layer 11B and the transparent sealing film 110 are formed.

With the above structure, one of the electrode layers of the capacitive element 23 has a structure in which electrode block layers are connected in the planar direction through the conductive lines, thereby making it possible to disconnect, from the capacitive element, an electrode block layer containing an unnecessary particle or the like through the laser irradiation of the conductive lines. Moreover, it is possible to prevent the region of the capacitive element from being damaged by the laser irradiation of the conductive lines because the other electrode layer is not formed in the regions on which the conductive lines are projected in the layer-stacking direction. As a result, although the capacitance is reduced by the area proportion of the disconnected electrode block layer, the capacitive element becomes capable of holding a voltage corresponding to a signal voltage provided through a corresponding data line and of causing the luminescent element to produce luminescence with proper luminescent timing.

However, only allowing the defective luminescent pixel to produce luminescence with proper luminescent timing as described above is insufficient because the capacitance changes when an electrode layer of the capacitive element 23 is disconnected on a per-electrode block layer basis. That is to say, the capacitance of the capacitive element included in the repaired luminescent pixel is reduced by the area proportion of the disconnected electrode block layer.

As a consequence, although a voltage held by the capacitive element 23 according to a signal voltage supplied from a corresponding signal line remains basically unchanged in a steady state, an off-leak current or the like in a thin-film transistor dedicated for pixel selection increases the speed of attenuation of the voltage held by the capacitive element whose capacitance has been reduced. The change in the speed of attenuation of the held voltage results in a difference in luminance between the repaired luminescent pixel and normal luminescent pixels, thereby causing a problem that complete luminance uniformity cannot be achieved with the same signal voltage.

The image display device 1 according to Embodiment 1 of the present invention solves this problem and achieves highly precise luminance modification. Hereinafter, a structure and operation enabling the highly precise luminance modification are described.

Figure 8A:
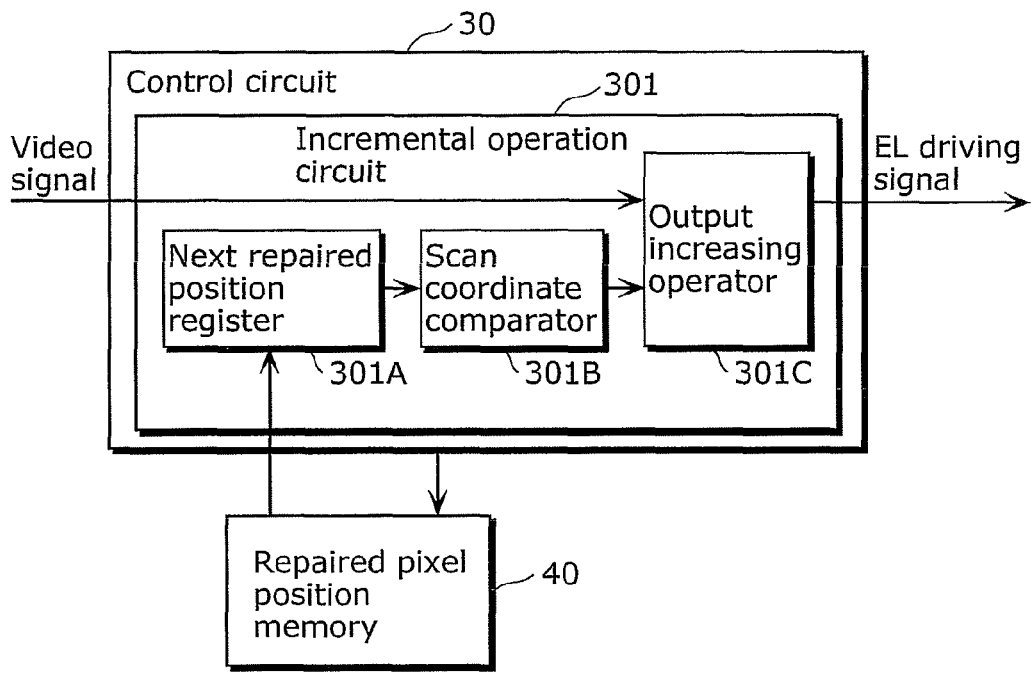
FIG. 8A is a functional block diagram showing a structure of a control circuit included in an image display device according to Embodiment 1 of the present invention.

FIG. 8A is a functional block diagram showing a structure of a control circuit included in the image display device according to Embodiment 1 of the present invention. The control circuit 30 shown in FIG. 8A includes the incremental operation circuit 301 as previously described. The incremental operation circuit 301 has a function to increase luminescent pixel signals corresponding to repaired luminescent pixels and output the increased luminescent pixel signals after reading only coordinate information from the repaired pixel position memory 40 in which information on pixel coordinates of the repaired luminescent pixels in the luminescent panel 10 are stored in the scanning order, and comparing information of input video signals with the coordinate information in the scanning order.

The incremental operation circuit 301 includes a next repaired position register 301A, a scan coordinate comparator 301B, and an output increasing operator 301C.

After a luminescent pixel signal corresponding to a first repaired luminescent pixel is output from the output increasing operator 301C to the signal line driving circuit 15, the next repaired position register 301A reads the coordinate information stored in the repaired pixel position memory 40 to read only the coordinates of a second repaired luminescent pixel that are stored next to the coordinates of the first repaired luminescent pixel.

Now, the repaired pixel position memory 40 is described. After the capacitive element 23 is repaired as described above, coordinate information of repaired luminescent pixels in the luminescent panel 10 each having a repaired capacitive element 23 are stored in the repaired pixel position memory 40 in the scanning order.

Figure 8B:
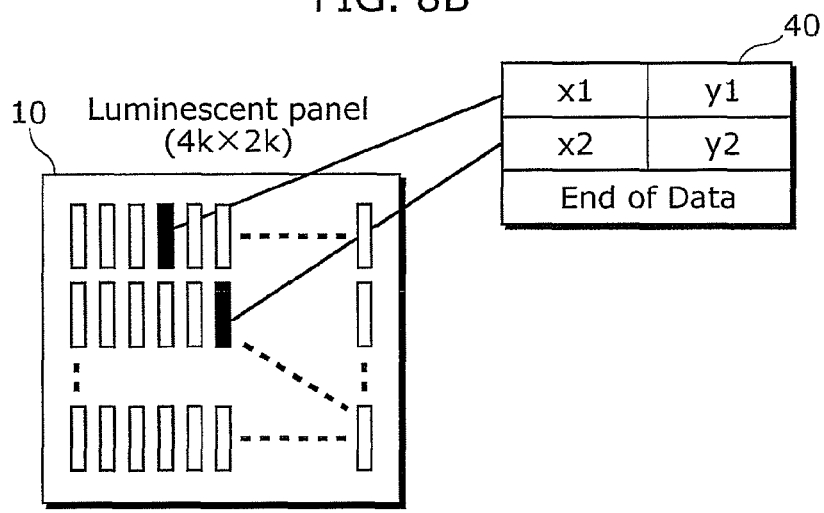
FIG. 8B is a diagram for explaining how data is stored in a repaired pixel position memory included in an image display device according to Embodiment 1 of the present invention.

FIG. 8B is a diagram for explaining how data is stored in the repaired pixel position memory included in the image display device according to Embodiment 1 of the present invention. The repaired pixel position memory 40 is a nonvolatile memory, for example, and sub-pixel address data that are coordinate information of repaired luminescent pixels are stored therein in the scanning order, for example. For example, assume that the luminescent panel is made up of 4 k×2 k sub-pixels and that the sub-pixel address data of luminescent pixels each having a repaired capacitive element are (x1, y1) and (x2, y2). Assume also that the luminescent pixel (x1, y1) is scanned before the luminescent pixel (x2, y2). In this case, (x1, y1) and (x2, y2) are stored in the repaired pixel position memory 40 in this order as coordinate information data of the repaired luminescent pixels. In addition, at end of the data, data indicating the end of the coordinate information data of the repaired luminescent pixels (End of Data) is stored. In this case, the number of bits necessary for storing sub-pixel address data of one repaired luminescent pixel is 23 bits, which is a sum of 12 bits necessary for storing x1 and 11 bits necessary for storing y1. In other words, (23 bits×(the number of repaired luminescent pixels+1)) bits is sufficient for a memory region for storing sub-pixel address data of all the repaired luminescent pixels.

With the image display device according to an implementation of the present invention, the percentage of repaired luminescent pixels including a capacitive element to be repaired is extremely small according to an estimation based on the cause of the defectiveness. It is therefore unnecessary to use an independent memory element as the repaired pixel position memory 40, and the function of the memory according to an implementation of the present invention can be achieved even by using available space of a nonvolatile memory or the like originally included in the image display device. This enables cost reduction.

This eliminates the need to prepare a large-capacity memory for storing modification data of all the luminescent pixels.

The description now returns to the constituent elements of the incremental operation circuit 301.

The scan coordinate comparator 301B reads the sub-pixel address data of the second repaired luminescent pixel which has been read by the next repaired position register 301A, and detects sub-pixel address data of a current luminescent pixel for which a luminescent pixel signal is to be output, so as to compare the two pieces of sub-pixel address data.

Note that the sub-pixel address data of the current luminescent pixel may be detected by a built-in counting circuit or the like that counts the number of scanned pixels from the time when scanning of one frame starts. Alternatively, the sub-pixel address data of the current luminescent pixel may be provided by a constituent element of the control circuit 30.

When the comparison by the scan coordinate comparator 301B shows a match between the sub-pixel address data of the second repaired luminescent pixel and the sub-pixel address data of the current luminescent pixel, the output increasing operator 301C increases the luminescent pixel signal of the current luminescent pixel and outputs the increased luminescent pixel signal.

Next, a modification method performed by the control circuit included in the image display device 1 of the present embodiment is described.

Figure 9:
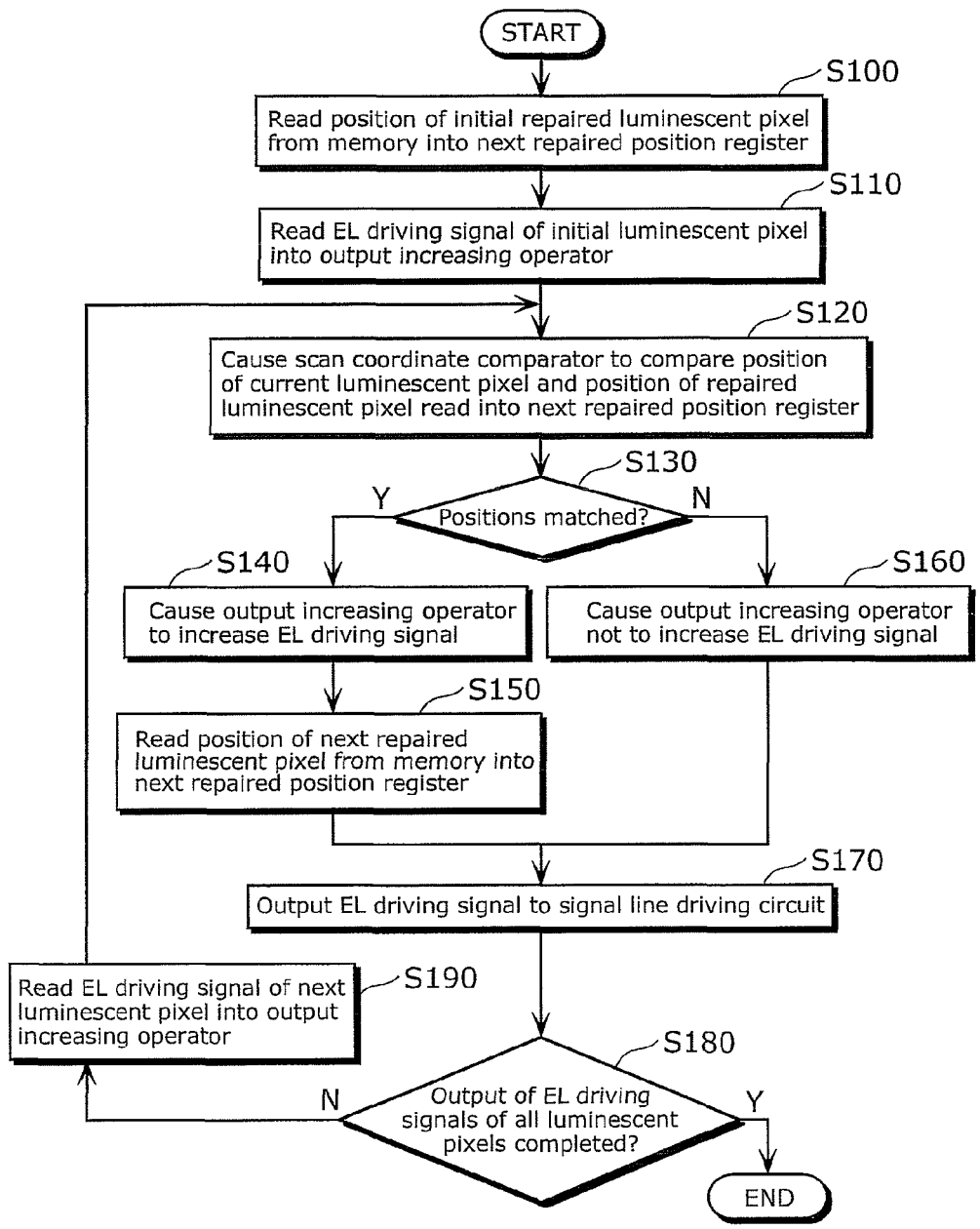
FIG. 9 is an operating flowchart showing a modification method performed by an image display device according to Embodiment 1 of the present invention.

FIG. 9 is an operating flowchart showing a modification method performed by the image display device according to Embodiment 1 of the present invention.

First, the control circuit 30 stores, in the scanning order in the repaired pixel position memory 40, sub-pixel address data of repaired luminescent pixels in the luminescent panel 10 (S95 not shown).

Note that Step S95 is an operation performed prior to shipment of the image display device according to an implementation of the present invention as a product, and does not have to be performed by the control circuit 30. Instead, an operating person who has repaired capacitive elements, for example, may directly write the sub-pixel address data of the repaired luminescent pixels into the repaired pixel position memory 40.

Next, the next repaired position register 301A reads, from the repaired pixel position memory 40, only the sub-pixel address data of an initial repaired luminescent pixel stored at the beginning of the repaired pixel position memory 40 (S100).

Next, the output increasing operator 301C reads luminescent pixel signal information which is an EL driving signal of an initial luminescent pixel to be scanned (S110).

Next, the scan coordinate comparator 301B compares the sub-pixel address data of the repaired luminescent pixel read by the next repaired position register 301A and sub-pixel address data of the luminescent pixel read by the output increasing operator 301C (S120).

After Step S120, when the result of the comparison by the scan coordinate comparator 301B between the two pieces of sub-pixel address data (S130) shows that they match, the output increasing operator 301C generates the luminescent pixel signal of the currently-read luminescent pixel by increasing the luminescent pixel signal of the currently-read luminescent pixel (S140). Furthermore, at this point in time, the next repaired position register 301A reads only the sub-pixel address data of a next repaired luminescent pixel from the repaired pixel position memory 40 (S150).

On the other hand, after Step S120, when the result of the comparison by the scan coordinate comparator 301B between the two pieces of sub-pixel address data (S130) shows that they do not match, the output increasing operator 301C does not increase the luminescent pixel signal of the currently-read luminescent pixel but retains the unchanged signal as the luminescent pixel signal of the currently-read luminescent pixel (S160).

Next, the control circuit 30 outputs, to the signal line driving circuit 15, the luminescent pixel signal of the luminescent pixel computed by the output increasing operator 301C (S170).

Next, the control circuit 30 determines whether or not the output of luminescent pixel signals corresponding to the luminescent pixels of one frame has been completed (S180).

When it is determined in Step S180 that the output of luminescent pixel signals corresponding to the luminescent pixels of one frame has been completed, the modification of the luminescent pixel signals for this frame is terminated.

When it is determined in Step S180 that the output of luminescent pixel signals corresponding to the luminescent pixels of one frame has not been completed, the output increasing operator 301C reads luminescent pixel signal information which is an EL driving signal of a next luminescent pixel to be scanned (S190).

After Step S190, the processing returns to Step S120, and thereafter, Steps S120 to S180 are repeated.

The above operation makes it possible to allow a repaired luminescent pixel having a capacitive element whose electrode layer which had caused a short circuit at the time of manufacturing has been partially cut off, to not only produce luminescence with the same luminescent timing as the other normal luminescent pixels but also produce luminescence with the same luminance as the normal luminescent pixels, by using only the coordinate information of the repaired luminescent pixel as modification data. This improves the display quality of the luminescent panel.

Furthermore, comparison, in the scanning order, between the sub-pixel address data of the luminescent pixels for which luminescent pixel signals are to be output and the sub-pixel address data of the repaired luminescent pixels stored in the repaired pixel position memory 40 allows modification of the luminescent pixel signals of the repaired luminescent pixels. This allows reduction in the load of processor processing by the control circuit 30.

Note that the capacitance of the repaired capacitive element is reduced from a designed value at a rate common to all the repaired luminescent pixels having the structure shown in FIG. 4, for example. Therefore, in increasing a luminescent pixel signal in Step S140, the luminescent pixel signals of all the repaired luminescent pixels can be increased with the same amplification factor. This allows reduction in the load on the control circuit because it is possible to fix, regardless of luminescent pixels, the amplification factor used in increasing the luminescent pixel signals of the repaired luminescent pixels.

Embodiment 2

Figure 10A:
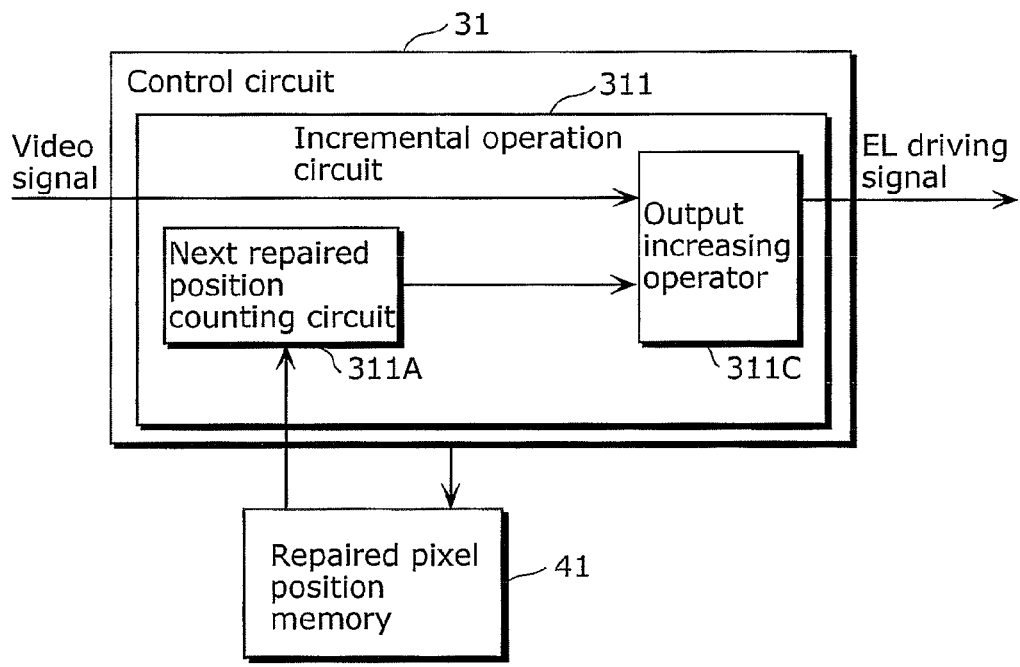
FIG. 10A is a functional block diagram showing a structure of a control circuit included in an image display device according to Embodiment 2 of the present invention.

FIG. 10A is a functional block diagram showing a structure of a control circuit included in an image display device according to Embodiment 2 of the present invention. A control circuit 31 shown in FIG. 10A includes an incremental operation circuit 311.

Compared with the image display device 1 according to Embodiment 1, the image display device according to Embodiment 2 of the present invention is different in structures of the control circuit and the repaired pixel position memory and in modifying operation of the control circuit. Hereinafter, the descriptions of the aspects common to Embodiment 1 are omitted, and only the different aspects are described.

The incremental operation circuit 311 has a function to increase luminescent pixel signals corresponding to repaired luminescent pixels and output the increased luminescent pixel signals after reading coordinate information from a repaired pixel position memory 41 in which information on pixel coordinates of the repaired luminescent pixels in the luminescent panel 10 are stored in the scanning order, and comparing information of input video signals with the coordinate information in the scanning order.

The incremental operation circuit 311 includes a next repaired position counting circuit 311A and an output increasing operator 311C.

After a luminescent pixel signal corresponding to a first repaired luminescent pixel is output from the output increasing operator 311C to the signal line driving circuit 15, the next repaired position counting circuit 311A reads the coordinate information stored in the repaired pixel position memory 41 to read only the number of scanned pixels from the first repaired luminescent pixel to a second repaired luminescent pixel which is to be scanned next. Furthermore, the next repaired position counting circuit 311A decrements the above number of scanned pixels by one when a luminescent pixel signal of a current luminescent pixel for which a luminescent pixel signal is to be output is output without being increased.

Now, the repaired pixel position memory 41 is described. After the capacitive element 23 is repaired as described in Embodiment 1, coordinate information of repaired luminescent pixels in the luminescent panel 10 each having a repaired capacitive element 23 are stored in the repaired pixel position memory 41 in the scanning order.

Figure 10B:
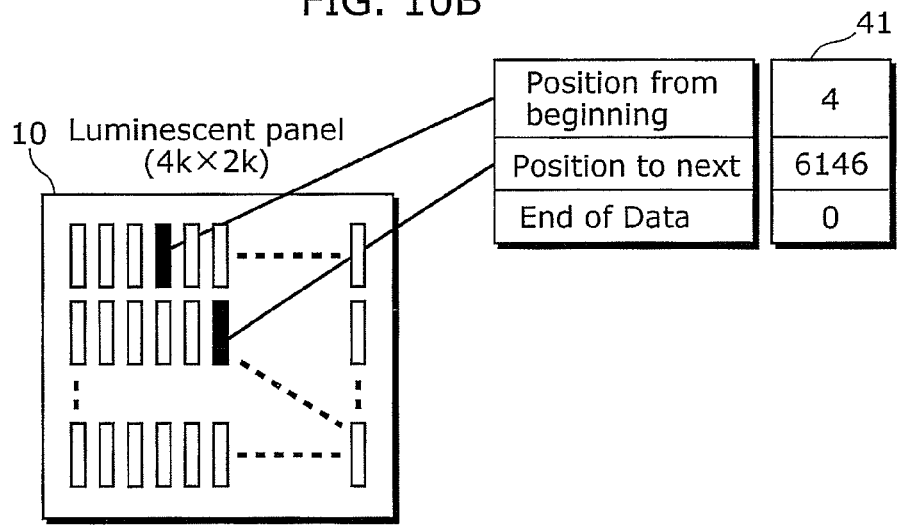
FIG. 10B is a diagram for explaining how data is stored in a repaired pixel position memory included in an image display device according to Embodiment 2 of the present invention.

FIG. 10B is a diagram for explaining how data is stored in the repaired pixel position memory included in the image display device according to Embodiment 2 of the present invention. The repaired pixel position memory 41 is a nonvolatile memory, for example, and run-length data that are coordinate information of repaired luminescent pixels are stored therein in the scanning order, for example. The run-length data is a relative number of scanned pixels from one repaired luminescent pixel to another repaired luminescent pixel which is to be scanned next to the one repaired luminescent pixel. However, in the case where the scan begins with the $0^{th}$ luminescent pixel, run-length data which is coordinate information of an initial repaired luminescent pixel is the number of scanned pixels from the $0^{th}$ luminescent pixel.

For example, assume that the luminescent panel is made up of 4 k×2 k sub-pixels and that the run-length data of luminescent pixels each having a repaired capacitive element are 4 and 6146. In this case, 4 and 6146 are stored in the repaired pixel position memory 41 in this order as the coordinate information data of the repaired luminescent pixels. In addition, at end of the data, data indicating the end of the coordinate information data of the repaired luminescent pixels (End of Data) is stored. In this case, the number of bits necessary for storing run-length data of one repaired luminescent pixel is 23 bits, which is the number of bits necessary for representing 4 k×2 k sub-pixels at maximum. In other words, a memory region for storing run-length data of all the repaired luminescent pixels can store (23 bits×(the number of repaired luminescent pixels+1)) bits at maximum.

With the image display device according to an implementation of the present invention, the percentage of repaired luminescent pixels including a capacitive element to be repaired is extremely small according to an estimation based on the cause of the defectiveness. It is therefore unnecessary to use an independent memory element as the repaired pixel position memory 41, and the function of the memory according to an implementation of the present invention can be achieved even by using available space of a nonvolatile memory or the like originally included in the image display device. This enables cost reduction.

This eliminates the need to prepare a large-capacity memory for storing modification data of all the luminescent pixels.

The description now returns to the constituent elements of the incremental operation circuit 311.

When the number of scanned pixels read by the next repaired position counting circuit 311A is one, the output increasing operator 311C increases a luminescent pixel signal of a current luminescent pixel and outputs the increased luminescent pixel signal.

Next, a method of modification performed by the control circuit 31 included in the image display device according to the present embodiment is described.

Figure 11:
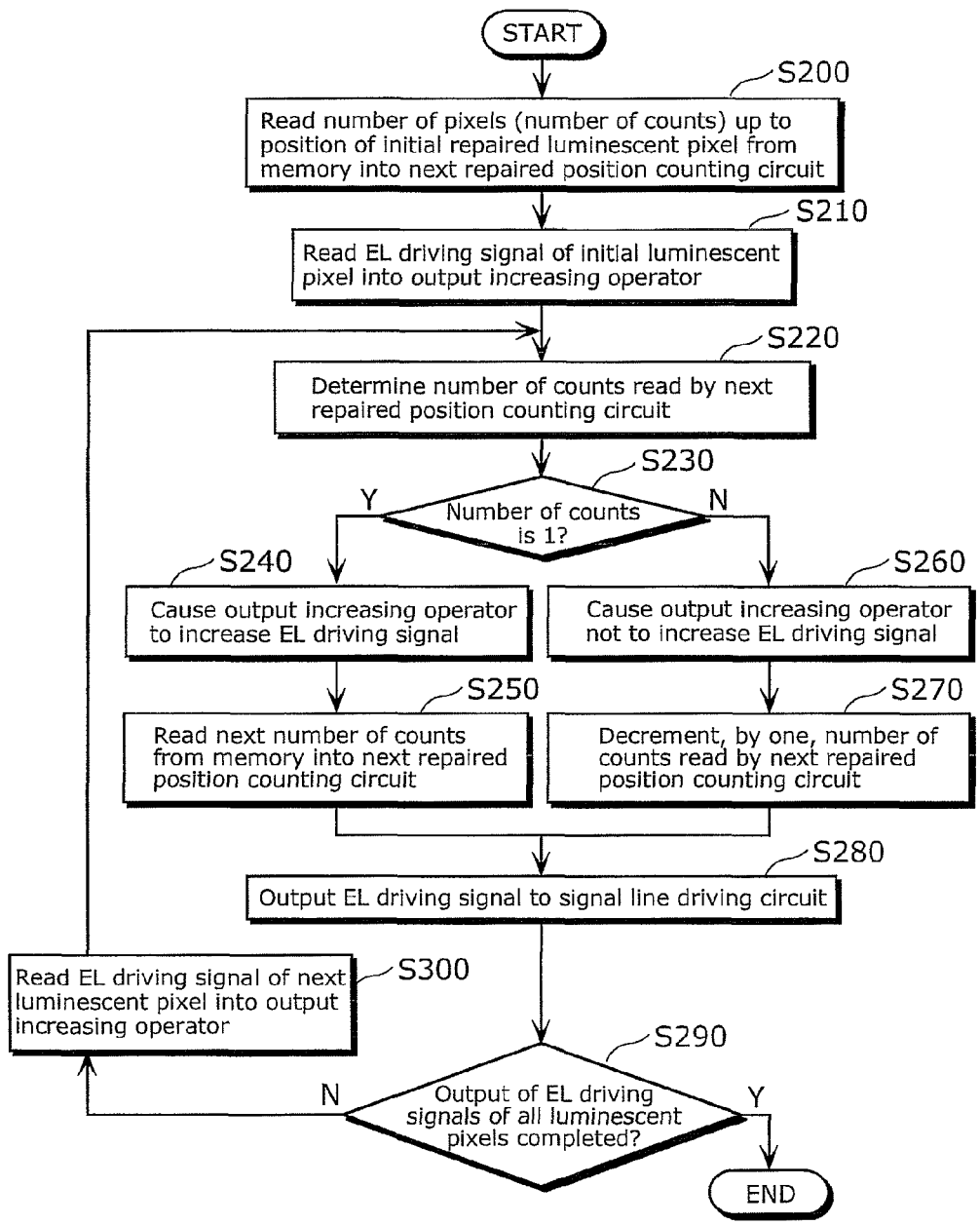
FIG. 11 is an operating flowchart showing a modification method performed by an image display device according to Embodiment 2 of the present invention.

FIG. 11 is an operating flowchart showing a modification method performed by the image display device according to Embodiment 2 of the present invention.

First, the control circuit 31 stores, in the scanning order in the repaired pixel position memory 41, run-length data of repaired luminescent pixels in the luminescent panel 10 (S195 not shown).

Note that Step S195 is an operation performed prior to shipment of the image display device according to an implementation of the present invention as a product, and does not have to be performed by the control circuit 31. Instead, an operating person who has repaired capacitive elements, for example, may directly write the run-length data of the repaired luminescent pixels into the repaired pixel position memory 41.

Next, the next repaired position counting circuit 311A reads, from the repaired pixel position memory 41, only the run-length data of an initial repaired luminescent pixel stored at the beginning of the repaired pixel position memory 41, as the number of counts (S200).

Next, the output increasing operator 311C reads luminescent pixel signal information which is an EL driving signal of an initial luminescent pixel to be scanned (S210).

Next, the control circuit 31 determines whether or not the run-length data of the repaired luminescent pixel read by the next repaired position counting circuit 311A is one (S220).

When it is determined in Step S220 that the run-length data of the repaired luminescent pixel read by the next repaired position counting circuit 311A is one, the output increasing operator 311C generates the luminescent pixel signal of the currently-read luminescent pixel by increasing the luminescent pixel signal of the currently-read luminescent pixel (S240). Furthermore, at this point in time, the next repaired position counting circuit 311A reads, from the repaired pixel position memory 41, only the run-length data of a next repaired luminescent pixel as the number of counts (S250).

When it is determined in S220 that the run-length data of the repaired luminescent pixel read by the next repaired position counting circuit 311A is not one, the output increasing operator 311C does not increase the luminescent pixel signal of the currently-read luminescent pixel but retains the unchanged signal as the luminescent pixel signal of the currently-read luminescent pixel (S260). Furthermore, at this point in time, the next repaired position counting circuit 311A decrements the currently-read run-length data by one (S270).

Next, the control circuit 31 outputs, to the signal line driving circuit 15, the luminescent pixel signal of the luminescent pixel computed by the output increasing operator 311C (S280).

Next, the control circuit 31 determines whether or not the output of luminescent pixel signals corresponding to the luminescent pixels of one frame has been completed (S290).

When it is determined in Step S290 that the output of luminescent pixel signals corresponding to the luminescent pixels of one frame has been completed, the modification of the luminescent pixel signals for this frame is terminated.

When it is determined in Step S290 that the output of luminescent pixel signals corresponding to the luminescent pixels of one frame has not been completed, the output increasing operator 311C reads luminescent pixel signal information which is an EL driving signal of a next luminescent pixel to be scanned (S300).

After Step S300, the processing returns to Step S220, and thereafter, Steps S220 to S290 are repeated.

With the above operation, it is possible to allow a repaired luminescent pixel having a capacitive element whose electrode layer which had caused a short circuit at the time of manufacturing has been partially cut off, to not only produce luminescence with the same luminescent timing as the other normal luminescent pixels but also produce luminescence with the same luminance as the normal luminescent pixels, by using only the coordinate information of the repaired luminescent pixel as modification data. This improves the display quality of the luminescent panel.

In addition, with the counting circuit that decrements the number of scanned pixels between repaired luminescent pixels every time a scan is performed, it is possible to modify a luminescent pixel signal of a repaired luminescent pixel with simple logic processing, thereby allowing reduction in the load on the control circuit 31.

Note that the capacitance of the repaired capacitive element is reduced from a designed value at a rate common to all the repaired luminescent pixels having the structure shown in FIG. 5. Therefore, in increasing the output of a luminescent pixel signal in Step S240, the luminescent pixel signals of all the repaired luminescent pixels can be increased with the same amplification factor. This allows reduction in the load on the control circuit because it is possible to fix, regardless of luminescent pixels, the amplification factor used in increasing the luminescent pixel signals of the repaired luminescent pixels.

Thus far, the image display device and the modification method performed by the same according to an implementation of the present invention have been described based on embodiments. However, the image display device and the modification method performed by the same according to the present invention are not limited to such embodiments. The scope of the present invention also includes: other embodiments realized by combining arbitrary constituent elements of Embodiments 1 and 2; variations arrived at by making various modifications on Embodiments 1 and 2 that a person skilled in the art can conceive without departing from the scope of the present invention; and various apparatuses including the image display device according to an implementation of the present invention.

For example, the scope of the present invention also includes an image display device having a capacitive element whose conductive lines 234 are connected at positions different from that of the conductive lines 234 of the capacitive element 23 shown in FIG. 5A.

Furthermore, although Embodiment 1 has shown an example of dividing the electrode layer 232 of the capacitive element 23 into four electrode blocks, the number of electrode blocks may be any number as long as it is two or more in light of the percent defective of the luminescent pixels 11 and a necessary capacitance.

Moreover, although Embodiment 1 has described, as a factor causing the defectiveness of a capacitor, a short circuit between electrodes caused by particles or the like unevenly distributed between the electrodes, the short circuit according to this embodiment is not limited to a dead short-circuit. For example, the short circuit also includes a state where the resistance value or the capacitance value is very small as in the case of a point contact between particles.

Note that an example has been given in which the image display devices in Embodiments 1 and 2 perform the modification by amplifying a luminescent pixel signal since the capacitance of a repaired capacitive element has been reduced from a designed value. However, the present invention is not limited to this modification. For example, depending on the circuit configuration of the driving circuit layer, when the capacitance of the repaired capacitive element has been reduced from a designed value, there are some cases where the modification is performed by decreasing the luminescent pixel signal. Thus, the "increase" or "amplification" performed by the output increasing operator included in the image display device according to the present invention also refers to a decrease.

Figure 12:
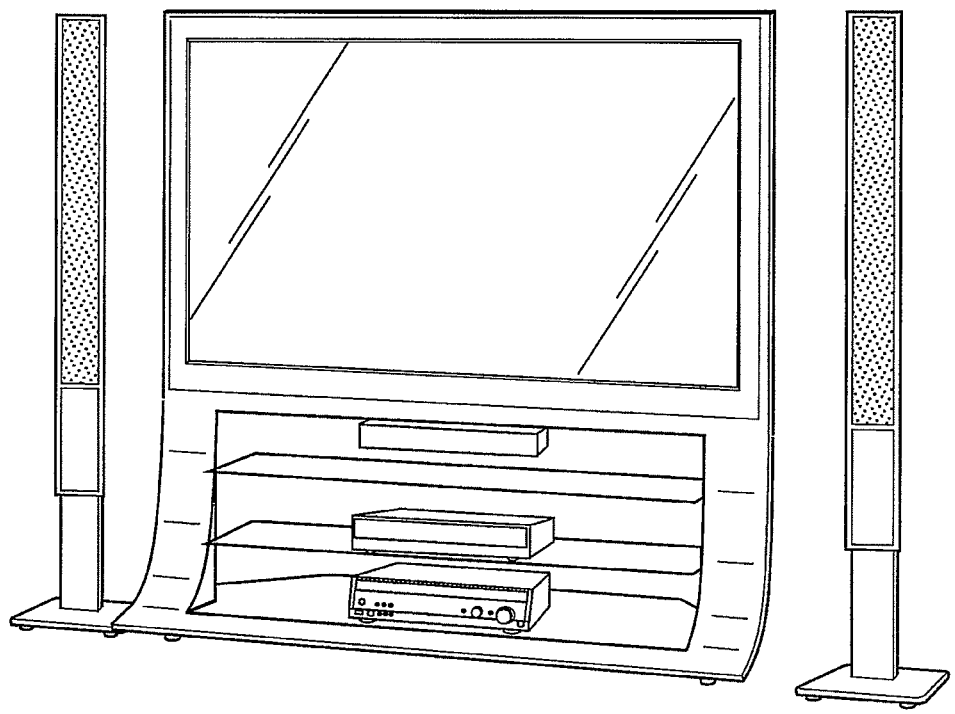
FIG. 12 is an external view of a thin flat TV including an image display device according to an aspect of the present invention.

Furthermore, the image display device according to an implementation of the present invention is included in a thin flat TV as shown in FIG. 12, for example. This allows providing a thin flat TV with an enhanced display panel quality through repairing of a luminescent pixel which does not produce luminescence with proper luminescent timing.

INDUSTRIAL APPLICABILITY

The image display device and the modification method performed by the same according to the present invention are useful in such technical fields as thin televisions and personal computer displays for which a large screen and high resolution are demanded.

What is claimed is:
1. An image display device, comprising:
 a luminescent panel in which luminescent pixels are two-dimensionally arranged, each of the luminescent pixels having a stacked structure of at least a luminescent layer and a driving layer, the driving layer including a capacitive element for driving the luminescent layer, the capacitive element including two electrode layers stacked in parallel;

a memory that stores coordinate information of a previously repaired luminescent pixel of the luminescent pixels, the capacitive element of the repaired luminescent pixel having been repaired through disconnection of a part of one of the two electrode layers included in the capacitive element; and a controller that converts video signals received by the image display device into luminescent pixel signals that determine luminescence of the luminescent pixels, and that outputs the luminescent pixel signals to a signal line driver in a scanning order, wherein the controller includes an incremental operator that increases and outputs one of the luminescent pixel signals that is associated with the previously repaired luminescent pixel after reading only the coordinate information from the memory and comparing information of the video signals with the coordinate information in the scanning order, the signal line driver outputs the increased one of the luminescent pixel signals to the previously repaired luminescent pixel and outputs unchanged luminescent pixel signals to normal luminescent pixels that have not been previously repaired, the one of the two electrode layers is planarly divided into electrode block layers, and when the two electrode layers are conductive, disconnection of one of the electrode block layers reduces a capacitance of the capacitive element from a designed value at a predetermined rate, the electrode block layers are connected through at least one conductive line, the electrode block layers and the at least one conductive line being coplanar, an other of the two electrode layers is a plate that defines at least one void, each of the at least one void corresponding to one of the at least one conductive line, and the previously repaired luminescent pixel is identified as having a short-circuited capacitive element, an abnormal electrode block layer of the short-circuited capacitive element is identified, the luminescent pixel being repaired by being irradiated with a laser to electrically insulate the abnormal electrode block layer of the capacitive element from other electrode block layers of the capacitive element.

2. The image display device according to claim 1,
wherein a plurality coordinates of previously repaired luminescent pixels are stored in the memory in the scanning order as the coordinate information, and
the incremental operator includes:
a next repaired position register that, after the one of the luminescent pixel signals that is output to the previously repaired luminescent pixel is increased and output, reads the coordinate information stored in the memory to read only coordinates of a second previously repaired luminescent pixel of the luminescent pixels that are stored next to coordinates of the one of the previously repaired luminescent pixel;
a scan coordinate comparator that compares the coordinates of the second repaired luminescent pixel with current coordinates of a current luminescent pixel of the luminescent pixels for which a second of the luminescent pixel signals is to be output; and
an output increasing operator that increases and outputs the second of the luminescent pixel signals when the scan coordinate comparator determines that the coordinates of the second repaired luminescent pixel match the current coordinates of the current luminescent pixel.

3. The image display device according to claim 1,
wherein a number of scanned pixels, which is a relative number of scanned pixels from the previously repaired luminescent pixel to a second previously repaired luminescent pixel of the luminescent pixels, is stored in the memory in the scanning order as the coordinate information, and
the incremental operator includes:
a next repaired position counter that, after the one of the luminescent pixel signals that is output to the previously repaired luminescent pixel is increased and output, reads the coordinate information stored in the memory to read only the number of scanned pixels from the previously repaired luminescent pixel to the second previously repaired luminescent pixel, and decrements the number of scanned pixels for each of the luminescent pixel signals that is output without being increased; and
an output increasing operator that increases and outputs a second of the luminescent pixel signals when the number of scanned pixels corresponds to the second previously repaired luminescent pixel.

4. The image display device according to claim 1, wherein the memory includes an area for storing data other than the coordinate information.

5. The image display device according to claim 1,
wherein the capacitive element holds a voltage that corresponds to a corresponding one of the luminescent pixel signals,
the driving layer further includes a driving transistor that has a gate connected to a terminal of the capacitive element and converts the voltage into a signal current that is a source-to-drain current when the voltage is applied to the gate, and
the luminescent layer includes a luminescent element that produces luminescence in response to the signal current.

6. A modification method performed by an image display device that includes a luminescent panel in which luminescent pixels are two-dimensionally arranged, each of the luminescent pixels having a stacked structure of at least a luminescent layer and a driving layer, the driving layer including a capacitive element for driving the luminescent layer, the capacitive element including two electrode layers stacked in parallel, the modification method comprising:
storing, in a memory, coordinate information of a previously repaired luminescent pixel of the luminescent pixels, the capacitive element of the previously repaired luminescent pixel having been repaired through disconnection of a part of one of the two electrode layers included in the capacitive element; and
when luminescent pixel signals, into which video signals received by the image display device are converted to correspond to the luminescent pixels, are output to a driver in a scanning order, increasing and outputting one of the luminescent pixel signals to the previously repaired luminescent pixel after reading only the coordinate information from the memory and comparing information of the video signals with the coordinate information in the scanning order and driving the previously luminescent pixel with the output luminescent pixel,
wherein the one of the two electrode layers is planarly divided into electrode block layers, and when the two electrode layers are conductive, disconnection of one of the electrode block layers reduces a capacitance of the capacitive element from a designed value at a predetermined rate, the electrode block layers are connected through at least one conductive line, the electrode block layers and the at least one conductive line being coplanar, an other of the two electrode layers is a plate that defines at least one void, each of the at least one void corresponding to one of the at least one conductive line, the previously repaired luminescent pixel is identified as having a short-circuited capacitive element, an abnormal electrode block layer of the short-circuited capacitive element is identified, the luminescent pixel being repaired by being irradiated with a laser to electrically insulate the abnormal electrode block layer of the capacitive element from other electrode block layers of the capacitive element.

7. The modification method according to claim 6, wherein a capacitance of the capacitive element repaired through disconnection of the part of the one of the two electrode layers is reduced from a designed value at a rate common to all previously repaired luminescent pixels, and the one of the luminescent pixel signals that corresponds to the previously repaired luminescent pixel is increased by an amplification factor common to all previously repaired luminescent pixels and output to the driver.

8. The modification method according to claim 7, wherein coordinates of previously repaired luminescent pixels are stored in the memory in the scanning order as the coordinate information, and the modification method further comprises:

reading, from the memory into a next repaired position register, after the one of the luminescent pixels that is output to the previously repaired luminescent pixel is increased and output to the driver, coordinates of a second previously repaired luminescent pixel of the luminescent pixels that are stored in the memory next to coordinates of the one of the previously repaired luminescent pixel;

comparing, with a scan coordinate comparator, the coordinates of the second previously repaired luminescent pixel with current coordinates of a current luminescent pixel of the luminescent pixels for which a second of the luminescent pixel signals is to be output; and increasing and outputting the second of the luminescent pixel signals when the scan coordinate comparator determines that the coordinates of the second previously repaired luminescent pixel match the current coordinates of the current luminescent pixel.

9. The modification method according to claim 7, wherein a number of scanned pixels, which is a relative number of scanned pixels from the previously repaired luminescent pixel to a second previously repaired luminescent pixel of the luminescent pixels, is stored in the memory in the scanning order as the coordinate information, and the modification method further comprises:

reading, from the memory into a next repaired position counter, after the one of the luminescent pixels that corresponds to the repaired luminescent pixel is increased and output to the driver, the number of scanned pixels from the previously repaired luminescent pixel to the second repaired luminescent pixel;

increasing and outputting a current one of the luminescent pixel signals when the number of scanned pixels corresponds to the second previously repaired luminescent pixel; and outputting the current one of the luminescent pixel signals without increasing the current one of the luminescent pixel signals and decrementing the number of scanned pixels when the number of scanned pixels does not correspond to the second previously repaired luminescent pixel.

10. The image display device according to claim 1, wherein the incremental operator increases the one of the luminescent pixel signals output to the previously repaired luminescent pixel with an amplification factor common to all repaired luminescent pixels.

11. The modification method according to claim 6, wherein the electrode block layers in each of the luminescent pixels have a same shape.

12. The image display device according to claim 1, wherein the electrode block layers in each of the luminescent pixels have a same shape.

* * * * *